(12) United States Patent
Cook et al.

(10) Patent No.: US 10,390,433 B2
(45) Date of Patent: Aug. 20, 2019

(54) METHODS OF FORMING CONDUCTIVE AND RESISTIVE CIRCUIT STRUCTURES IN AN INTEGRATED CIRCUIT OR PRINTED CIRCUIT BOARD

(71) Applicant: Texas Instruments Incorporated, Dallas, TX (US)

(72) Inventors: Benjamin S. Cook, Dallas, TX (US); Juan Alejandro Herbsommer, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/674,809

(22) Filed: Mar. 31, 2015

(65) Prior Publication Data
US 2016/0295696 A1    Oct. 6, 2016

(51) Int. Cl.
*H05K 1/16*      (2006.01)
*H05K 1/09*      (2006.01)
(Continued)

(52) U.S. Cl.
CPC ......... *H05K 1/167* (2013.01); *H01L 21/4864* (2013.01); *H01L 23/49822* (2013.01);
(Continued)

(58) Field of Classification Search
CPC ............. H05K 1/167; H05K 2203/107; H05K 2203/1142; H05K 2203/171; H01C 17/06586; H01C 17/26
(Continued)

(56) References Cited

U.S. PATENT DOCUMENTS

| 3,138,744 A | 6/1964 | Kilby |
| 3,359,467 A | 12/1967 | Cook, Jr. |

(Continued)

FOREIGN PATENT DOCUMENTS

WO    WO2013-027781    *    2/2013

OTHER PUBLICATIONS

International Search Report and Written Opinion for PCT/US2016/025442 dated Jun. 23, 2016.
(Continued)

*Primary Examiner* — Steven T Sawyer
(74) *Attorney, Agent, or Firm* — Ebby Abraham; Charles A. Brill; Frank D. Cimino

(57) ABSTRACT

Described examples include methods of fabricating conductive and resistive structures by direct-write variable impedance patterning using nanoparticle-based metallization layers or chemical reaction-based deposition. In some examples, a low conductivity nanoparticle material is deposited over a surface. The nanoparticle material is selectively illuminated at different applied energy levels via illumination source power adjustments and/or scan rate adjustments for selective patterned sintering to create conductive circuit structures as well as resistive circuit structures including gradient resistive circuit structures having an electrical resistivity profile that varies along the structure length. Further examples include methods in which a non-conductive reactant layer is deposited or patterned, and a second solution is deposited in varying amounts using an additive deposition for reaction with the reactant layer to form controllably conductive structures.

21 Claims, 28 Drawing Sheets

(51) Int. Cl.
    *H05K 3/30* (2006.01)
    *H01L 23/522* (2006.01)
    *H01L 27/08* (2006.01)
    *H01L 23/498* (2006.01)
    *H01L 21/48* (2006.01)
    *H05K 3/12* (2006.01)

(52) U.S. Cl.
    CPC ...... *H01L 23/5228* (2013.01); *H01L 27/0802* (2013.01); *H05K 1/09* (2013.01); *H05K 1/097* (2013.01); *H05K 3/1283* (2013.01); *H05K 3/30* (2013.01); *H05K 2203/107* (2013.01); *H05K 2203/1131* (2013.01); *H05K 2203/1157* (2013.01)

(58) Field of Classification Search
    USPC .................................. 438/382; 174/261, 257
    See application file for complete search history.

(56) References Cited

U.S. PATENT DOCUMENTS

| | | | |
|---|---|---|---|
| 4,467,311 A | 8/1984 | Person et al. | |
| 4,579,600 A | 4/1986 | Shah et al. | |
| 5,855,755 A | 1/1999 | Murphy et al. | |
| 6,002,564 A * | 12/1999 | Ohtsuchi | H01H 85/048 361/103 |
| 6,037,066 A * | 3/2000 | Kuwabara | B22F 7/008 257/675 |
| 6,261,915 B1 | 7/2001 | Eklund et al. | |
| 6,326,256 B1 | 12/2001 | Bailey et al. | |
| 7,449,783 B2 | 11/2008 | Beach et al. | |
| 8,710,904 B2 | 4/2014 | Polley | |
| 2003/0108664 A1* | 6/2003 | Kodas | C09D 11/30 427/125 |
| 2004/0214452 A1* | 10/2004 | Freeman | H01C 17/06586 438/795 |
| 2005/0151615 A1* | 7/2005 | Nugent | B82Y 10/00 338/13 |
| 2005/0214480 A1 | 9/2005 | Garbar et al. | |
| 2006/0057502 A1 | 3/2006 | Okada et al. | |
| 2006/0151202 A1* | 7/2006 | Das | H01G 4/206 174/256 |
| 2006/0163563 A1* | 7/2006 | Ulmer | H01C 17/065 257/40 |
| 2006/0163744 A1* | 7/2006 | Vanheusden | B82Y 30/00 257/773 |
| 2006/0176350 A1* | 8/2006 | Howarth | B41J 2/01 347/102 |
| 2006/0211187 A1 | 9/2006 | Choi et al. | |
| 2009/0178271 A1* | 7/2009 | Egitto | H01C 17/06 29/620 |
| 2010/0035375 A1 | 2/2010 | Grigoropoulos et al. | |
| 2010/0302319 A1* | 12/2010 | Akedo | H05K 3/1208 347/54 |
| 2012/0168684 A1 | 7/2012 | Magdassi et al. | |
| 2013/0033840 A1* | 2/2013 | Welling | G06K 19/07345 361/783 |
| 2013/0342221 A1 | 12/2013 | Virkar et al. | |
| 2014/0080258 A1 | 3/2014 | Rathbun | |
| 2014/0161971 A1 | 6/2014 | Kasai | |
| 2014/0238833 A1 | 8/2014 | Virkar et al. | |
| 2015/0201489 A1* | 7/2015 | Foong | H05K 1/097 361/783 |

OTHER PUBLICATIONS

Kamyshny, et al.; "Metal-based Inkjet Inks for Printed Electronics"; The Open Applied Physics Journal; 2011; 4; pp. 19-36.
Ko, et al.; "All-inkjet-printed flexible electronics fabrication on a polymer substrate by low-temperature high-resolution selective laser sintering of metal nanoparticles"; IOP Publishing; Nanotechnology 18; 2007; pp. 1-8.
European Search Report for EP 16774272.5 dated Mar. 21, 2018.
Supplementary European Search Report; Application No. EP16774272.5-1203/3278359, PCT/US2016025442; Completion Date: Aug. 29 2018; dated Sep. 5, 2018; 2 pages.

* cited by examiner

METHODS OF FORMING CONDUCTIVE AND RESISTIVE CIRCUIT STRUCTURES IN AN INTEGRATED CIRCUIT OR PRINTED CIRCUIT BOARD

TECHNICAL FIELD

This disclosure relates generally to integrated circuit manufacturing, and more particularly to forming conductive and resistive circuit structures having different impedance values per unit area in a circuit structure.

BACKGROUND

Integrated circuits (ICs) provide a cost effective compact solution for electrical circuits, typically including diodes, transistors, memory cells, logic circuits, and other circuitry with I/O terminals for interfacing the internal circuitry with external components on a printed circuit board (PCB). In addition to complex circuitry, many integrated circuits include internal capacitors and resistors, thereby mitigating the need for additional cost and circuit board space associated with providing external discrete components. In particular, resistors and conductive traces are sometimes formed during fabrication of one or more metallization layers to interconnect transistor terminals and other internal circuit components with one another and with externally accessible die pads. Printed circuit boards also include conductive traces or features for electrically interconnecting various components, such as discrete resistors, capacitors, diodes, and integrated circuits soldered to the board. For many applications, it may be desirable to embed resistors within metal traces in an integrated circuit metallization layer and/or on a printed circuit board to mitigate the need for discrete resistors thereby saving space and cost. Also, gradient resistance transmission lines are often desirable for infinite impedance matching, as well as gradient resistance features for current profile tapering.

Metallization layer processing typically involves creating geometrically patterned traces of copper or other suitable metal to create a patterned variation in resistance on a trace or feature. Embedded resistors can be created by adjusting the area (e.g., metal trace width) and/or length of a metallization layer structure, and gradient resistance transmission lines can also be created through geometric patterning for infinite impedance matching, current profile tapering or other applications. For example, the width or thickness of a metallization layer or printed circuit board trace may be narrowed to decrease the cross-sectional area, and the path of the trace may be extended through meandering or other length extending techniques to increase the resistance. Also, the trace width can be narrowed through tapering to provide a gradually increasing resistance. However, conventional metallization layer processing for integrated circuits and/or printed circuit boards may be limited in the ability to create integrated resistors, particularly gradient resistors, within cost and space restrictions. In particular, current techniques require either a change in geometry of the metallization layer trace and/or deposition of other materials that have a higher or lower resistance per square.

Geometrically varying feature shapes and lengths to create lower resistance features may not be practical in certain situations because of space or area limitations, while cost, complexity and fabrication tolerances may limit the feasibility of creating higher resistances and/or gradient resistors. These conventional techniques may be unsuitable for high frequency structures where the geometry of the metallization is directly linked to high frequency performance, or for gradient current profile tapering. The other approach involves depositing two or more materials onto a PCB or integrated circuit metallization layer, which have different impedance per unit area values (ohms per square). However, this technique increases cost and fabrication time, and still only allows for a discrete number of degrees of freedom in creating different resistances and profiled resistances. As a result, this approach is often used in combination with geometric patterning, which may be contrary to size restrictions for a given design. Thus, conventional techniques involving variations to trace geometry are limited by available space for low resistances and by process restrictions for minimum trace widths and minimum feature sizes in creating high resistances.

SUMMARY

Methods are provided for fabricating conductive and resistive structures in an integrated circuit or on a circuit board using direct-write variable impedance patterning via nanoparticle-based metallization layers or chemical reaction-based deposition, along with integrated circuits or printed circuit boards comprising resistive structures formed on a planar structure having different electrical resistivities. In certain methods, a low conductivity nanoparticle material is selectively illuminated at different applied energy levels for creating conductive and resistive circuit structures and gradient resistive circuit structures. Methods are also provided in which a non-conductive reactant layer is deposited and a second solution is deposited in varying amounts using an additive deposition for reaction with the reactant layer to form structures with tailored conductivities. A circuit apparatus is provided in which conductive structures and resistive structures are formed on a planar surface from the same material and have different resistivities.

BRIEF DESCRIPTION OF THE DRAWINGS

FIG. 3 is a partial top plan view of the integrated circuit of FIG. 2 following deposition of the metallic nanoparticle material layer.

FIG. 25 is a partial top plan view of the integrated circuit of FIG. 24 following the reactant material deposition.

DETAILED DESCRIPTION

Figure 1:
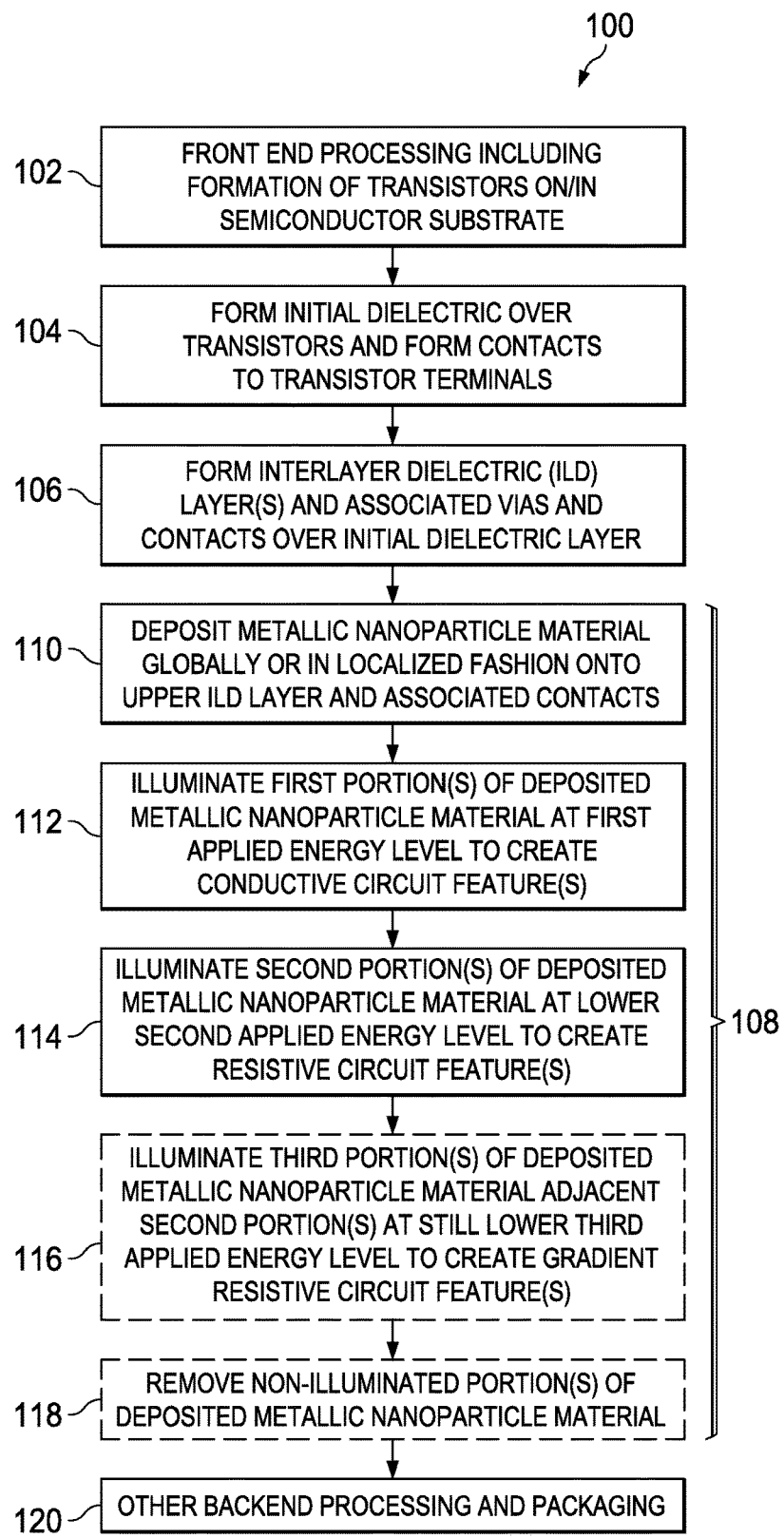
FIG. 1 is a flow diagram of a first method of forming conductive and resistive structures by variable impedance patterning in an integrated circuit.

In the drawings, like reference numerals refer to like elements throughout, and the various features are not necessarily drawn to scale.

FIG. 1 illustrates a process or method 100 for fabricating conductive and resistive structures in an integrated circuit or on a printed circuit board, and FIGS. 2-8 show an integrated circuit (IC) 200 at various intermediate fabrication stages according to the method 100. The process 100 is illustrated in the context of integrated circuit fabrication for forming conductive and resistive structures on a dielectric layer in a metallization process. In other examples, portions of the method 100 can be used in fabricating printed circuit boards or other circuit structures in which conductive and resistive features are formed on a planar surface.

The method 100 in FIG. 1 begins at 102 with front end processing such as formation of transistors on or in a semiconductor substrate. At 104, an initial dielectric is formed over the transistors and contacts are formed in the initial dielectric to the transistor terminals. One or more interlayer dielectric (ILD) layers is/are formed at 106 along with associated vias and contacts over the initial dielectric layer.

Figure 2:
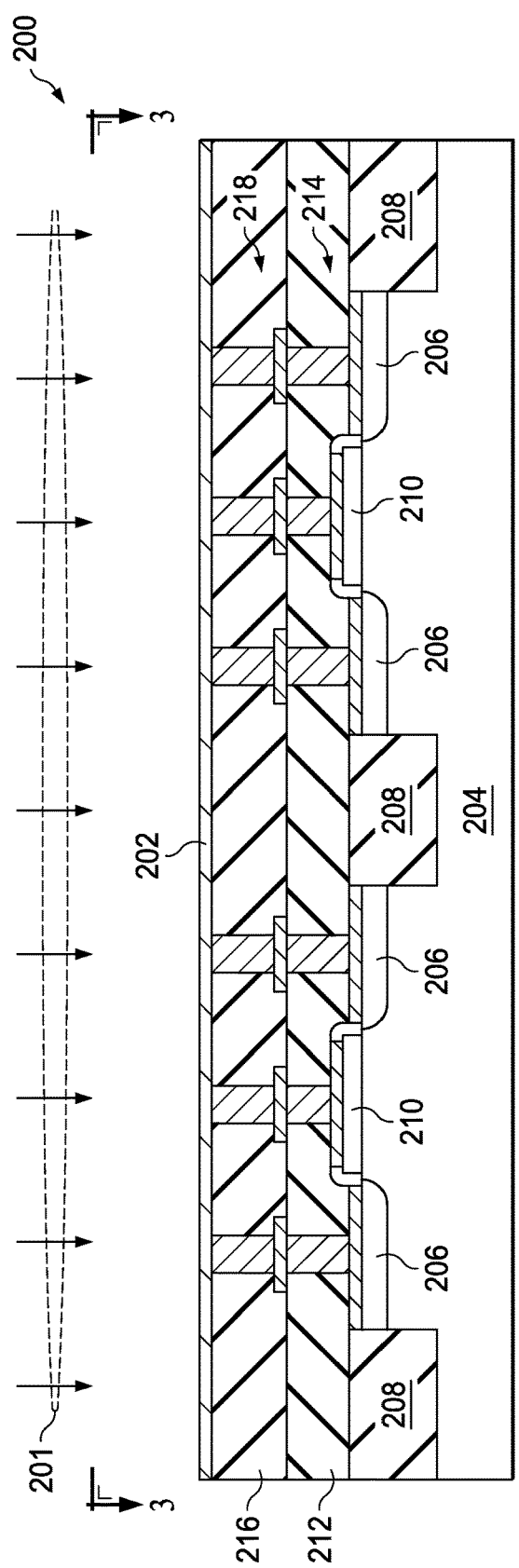
FIG. 2 is a partial side elevation view of an integrated circuit undergoing a deposition process to form a layer of metallic nanoparticle material on an upper interlayer dielectric and associated contacts.

FIG. 2 shows the IC 200 at an intermediate fabrication stage following the processing at 102-106 of FIG. 1, and includes a semiconductor body 204 (e.g., silicon substrate or SOI wafer) in which transistor source/drains 206 are formed in doped active regions of the substrate 204 and are separated by STI or LOCOS isolation structures 208, and transistor gate structures 210 are formed over channel regions of the substrate 204. An initial ILD layer (e.g., poly metal dielectric, PMD) 212 is formed over the transistors and the substrate (104 in FIG. 1), through which conductive contacts 214 are formed of any suitable conductive material or materials (e.g., tungsten) for interconnection of the source/drain and gate terminals 206, 210. A second ILD layer 216 is formed above the first layer 212, 214, including a dielectric material layer 216 with a planar top surface, as well as contacts or vias 218 as shown in FIG. 2.

As described further below, the process 100 in FIG. 1 includes direct-write variable impedance patterning via nanoparticle-based metallization layer processing at 108 to form a conductive structure and one or more resistive structures including gradient resistor features on a planar dielectric layer such as the ILD layer 216 as part of a metallization process for constructing an integrated circuit 200. In other examples, the processing 108 can be used in forming conductive and resistive features or structures on a planar surface of a circuit board. Direct-write variable impedance patterning examples are described below using chemical reaction-based deposition processing (e.g., FIG. 23), which can also be employed in the fabrication of integrated circuit devices and/or in making printed circuit boards or other circuit structures. The dielectric layer 216, in this regard, is considered to provide a planar surface including any exposed conductive contacts 218.

Figure 3:
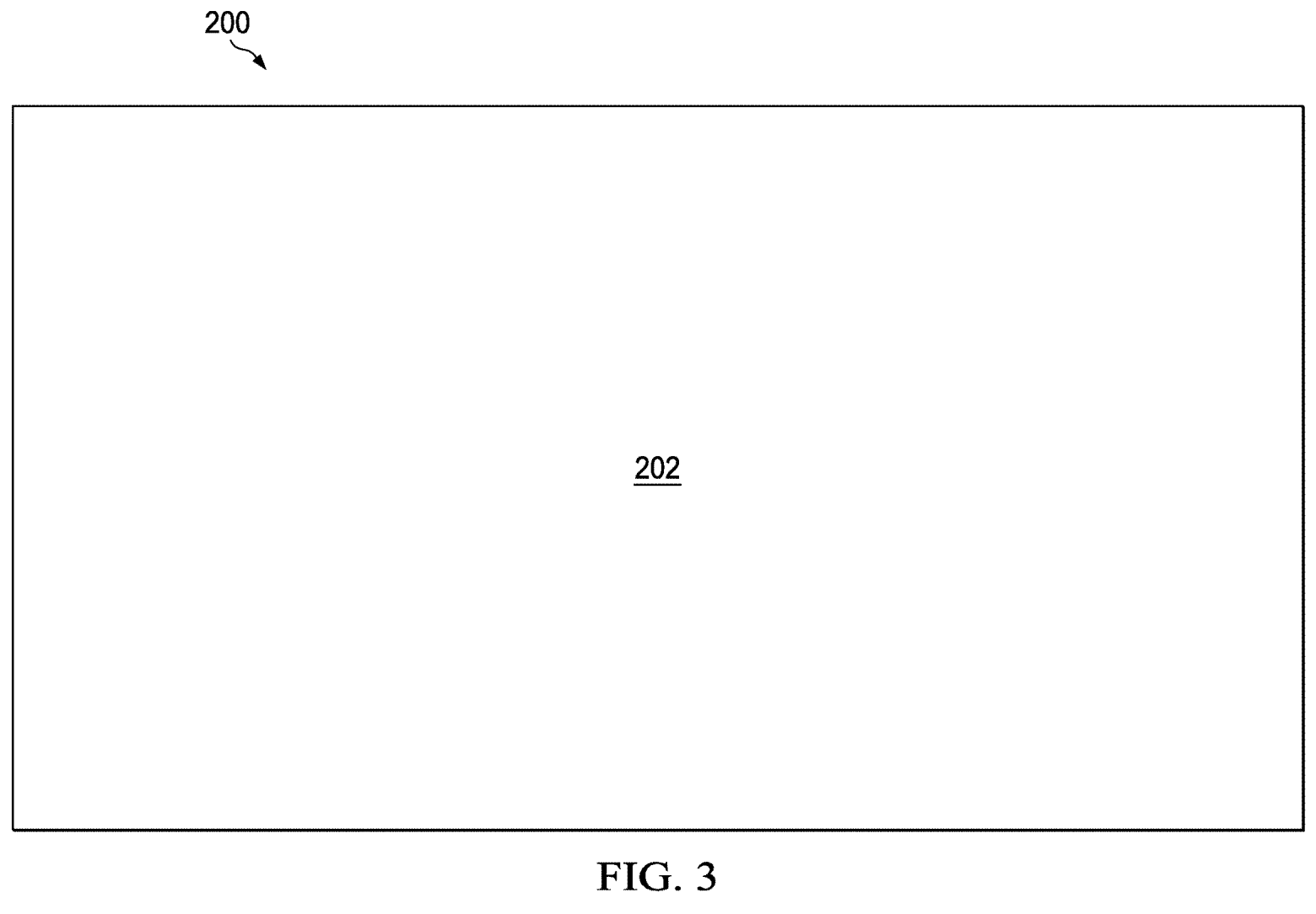

Referring to FIGS. 1-3, the metallization processing 108 begins at 110 in FIG. 1 with deposition of metallic nanoparticle material. Any suitable nanoparticle material may be used, and may be deposited using any suitable deposition processing at 110. FIG. 2 illustrates a deposition process 201 for deposition of metallic nanoparticle material 202 over the upper surface of the dielectric layer 216 including any exposed conductive material of the interlayer contacts 218, and FIG. 3 illustrates a top view of a globally deposited metallic nanoparticle layer 202 over all or substantially all of the planar surface of the dielectric 216. In other examples (e.g., FIGS. 17-22), the metallic nanoparticle material deposition at 102 can be selective deposition via an additive deposition process, or an initial global deposition and subsequent patterning can be employed at 110 to form a metallic nanoparticle material 202 globally or in localized fashion on the dielectric 216 and any associated vias and/or contacts. Any suitable metallic nanoparticle material 202 can be used at 110 in FIG. 1, such as copper, gold or other conductive nanoparticle material having particle sizes on the order of several nanometers to several hundred nanometers.

As initially deposited, the nanoparticle material includes a number of very small particles, which together initially constitute an essentially non-conductive material layer 202 (e.g., very low conductivity) including particles, which can be sintered by optically applied energy to increase the conductivity of select portions of the layer 202. The material 202 can be deposited at 110 by any suitable process 201, including spin coating, dipping, printing, and various other deposition methods to form a material 202 having an initial low conductivity. As used herein, this initially low conductivity is such that unreacted or non-illuminated portions of the deposited layer 202 will not conduct significant amounts of current when a subsequently formed conductive or resistive portion thereof is processed to have increased conductivity, and the non-illuminated portions of the material 202 operate in connection with a final circuit of the integrated circuit device 200 (or a final circuit of a PCB onto which the material 202 is formed at 110).

Figure 4:
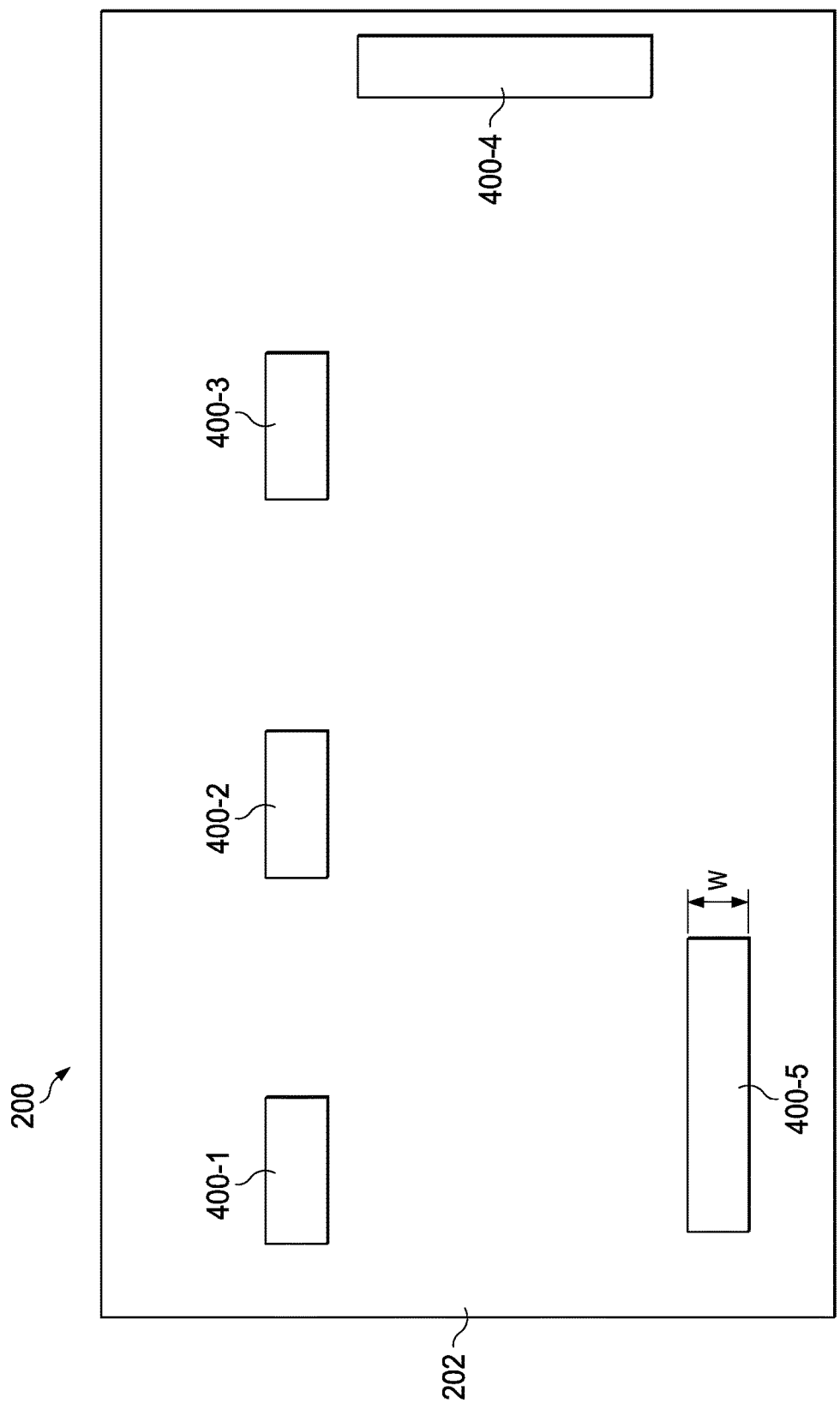
FIG. 4 is a top plan view of the integrated circuit of FIGS. 2 and 3 following illumination of first portions of the deposited metallic nanoparticle material at a first applied energy level to create conductive circuit structures.

Referring to FIGS. 1 and 4, the process 100 continues at 112 in FIG. 1, including illumination of one or more first portions of the deposited metallic nanoparticle material 202 at a first applied energy level to create one or more conductive circuit features. FIG. 4 illustrates selective illumination of five such first portions 400-1, 400-2, 400-3, 400-4 and 400-5, in which the illuminated first portion 400-5 has a width dimension W. The first applied energy level used at 112 is any amount of total applied energy per unit area with respect to the illuminated portions 400, which causes increases the conductivity of the illuminated metallic nanoparticle material 202 to a desired level. This final conductivity, together with the area and distance of the illuminated features 400 provides a preferably low resistance value for the individual illuminated portions or features 400 suitable for use in a resulting integrated circuit for achieving a desired current carrying capability and other circuit design performance metrics. As discussed further below in connection with FIGS. 9-16, a laser or other suitable light source 900 can illuminate the first portions 400 of the deposited metallic nanoparticle material 202 at a controlled energy level, such as by controlling the laser output power per unit illuminated surface area and/or by controlling a scan rate of the illumination source 900.

Figure 5:
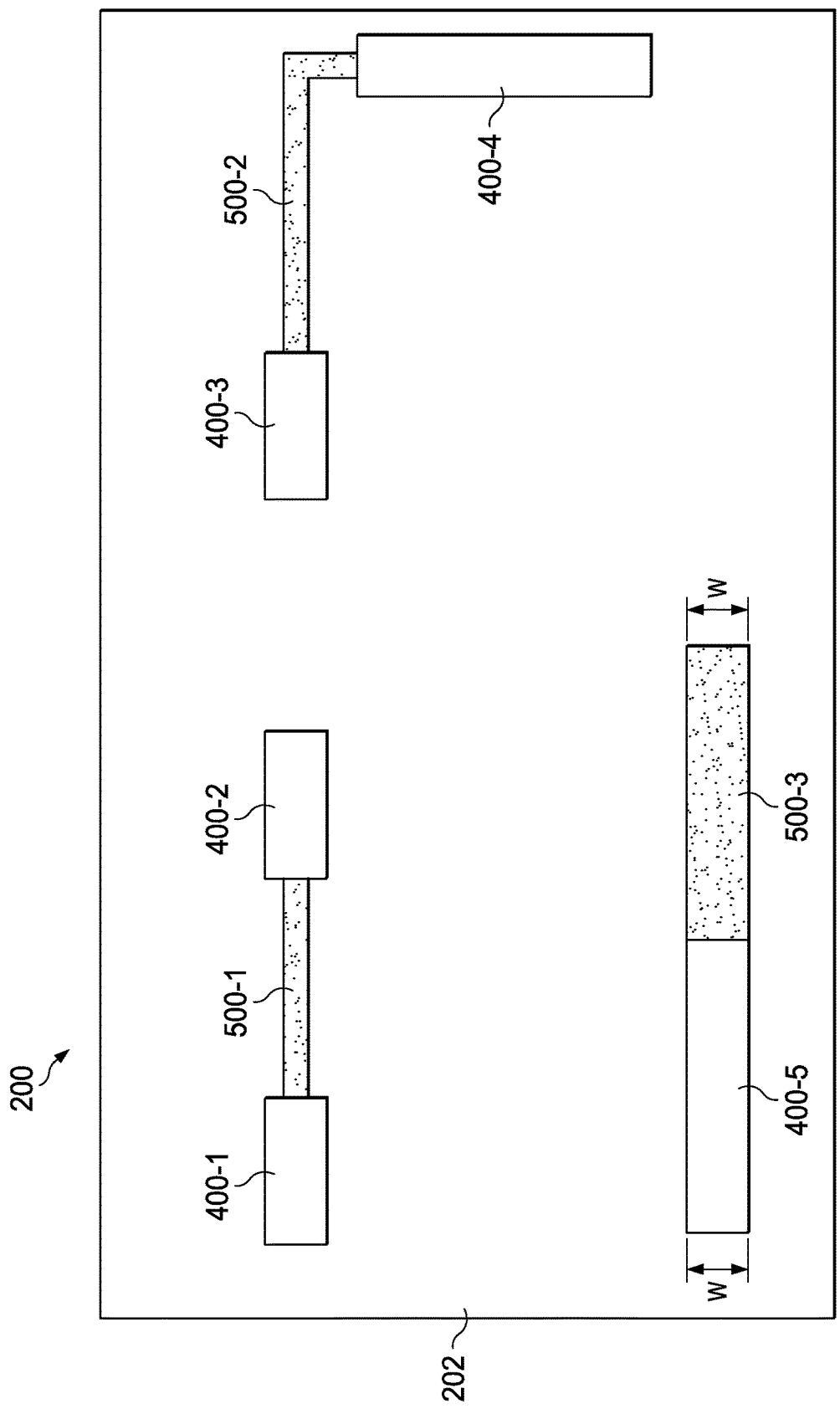
FIG. 5 is a partial top plan view of the integrated circuit of FIGS. 2-4 following illumination of second portions of the deposited metallic nanoparticle material at a lower second applied energy level to create resistive circuit structures.

Referring to FIGS. 1 and 5, second portions 500 of the deposited metallic nanoparticle material 202 are selectively illuminated at 114 at a lower second applied energy level to create resistive circuit structures 500-1, 500-2 and 500-3. The second applied energy level is less than the first applied energy level. In the example of FIG. 5, the resistive structure 500-3 has a width W, which equals a width of the example conductive structure 400-5. However, the second applied energy level used in creating the resistive structure 500-3 (and the other resistor structures 500-1 and 500-2) is less than the energy applied in creating the conductive structure 400-5, and accordingly the illuminated material structures 500 have a lower conductivity (i.e., higher resistivity) than the conductive structures 400. Thus, where the structures 400-5 and 500-3 have the same width dimensions and extend for the same lateral lengths or traced distances, the structure 500-3 has a higher resistance than the structure 400-5. The structures 400-5 and 500-3 have different electrical resistivities, although they are formed from the same initial first material 202. Accordingly, the processing 108 provides direct-write variable impedance patterning using a single deposited material, which can be employed in providing a variety of different conductive and resistive structures 400, 500 in the manufacture of integrated circuits and/or printed circuit boards or other circuit structures. The applied illumination energy can be modified dynamically, such as by using lasers. Accordingly, the process 100 advantageously facilitates cost effective metallization processes to create compact circuits including conductive traces and resistors as needed, without complicated or lengthy fabrication processing, and it avoids or mitigates problems associated with excessive circuitry size and process restrictions regarding minimal trace or feature sizes compared with conventional patterned metal layer techniques.

Figure 6:
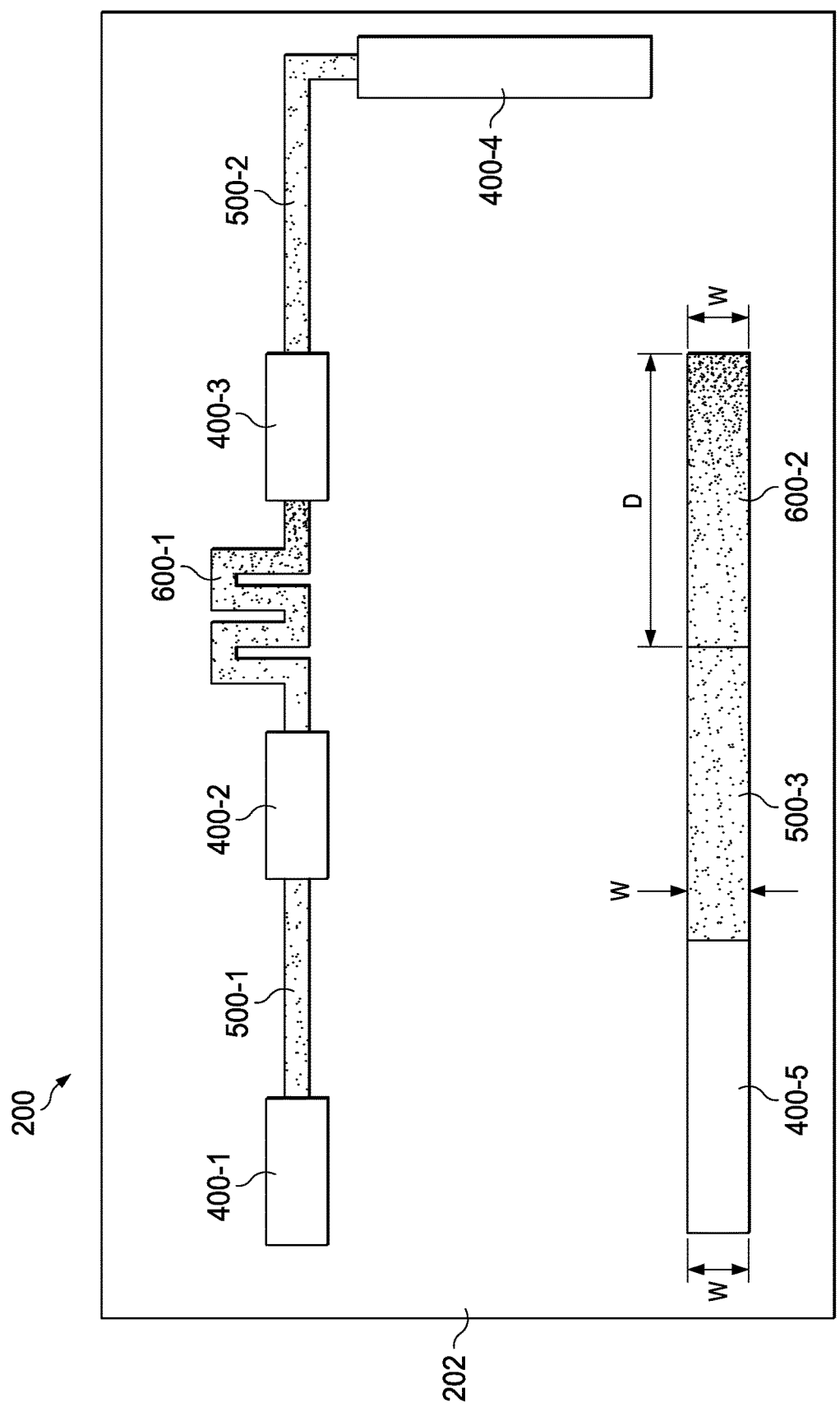
FIG. 6 is a partial top plan view of the integrated circuit of FIGS. 2-5 following variable or tapered power and/or scan rate illumination of further portions of the deposited metallic nanoparticle material to form gradient resistive circuit structures.

Referring also to FIG. 6, third portions of the deposited metallic nanoparticle material 202 are selectively illuminated at 116 in FIG. 1 to create further resistive structures 600-1 and 600-2. In this case, one of the third portions 600-2 is adjacent to the second portion 500-3, and the portion 600-2 is of the same width dimension W, and has a similar length or distance dimension D as the structures or illuminated portions 500-3 and 400-5. The third portions 600 are illuminated at 116 at an even lower third applied energy level (i.e., the third energy level is less than the second applied energy level in this example) to create the resistive structures 600 having higher resistivities than the structures 500. Also, the adjacent formation of the resistive structures 600-2 and 500-3 provides a gradient resistive structure, which includes the second and third illuminated portions 500-3 and 600-2 of the material 202. By this technique, therefore, a gradient resistive structure can be created from a single initial material 202 by varying the applied energy of the illumination source in creating the illuminated portions 500-3 and 600-2. In some examples, the third energy level is applied along the entire illuminated portion 600-2, and the resulting resistive structure 600-2 itself will have a generally continuous or constant resistivity along its lateral lengths.

In other examples, the processing at 116 includes gradually transitioning the applied energy from the second level to the third level while illuminating the portions 500-3 and 600-2 to create the gradient resistive circuit structure. In another example in FIG. 6, the processing of the third portions 600-1 and 600-2 involves gradually transitioning the applied energy from the second level to the third level to create a gradient resistive structure 600-1 between the conductive structures 400-2 and 400-3, as well as a composite gradient resistive structure 500-3, 600-2, with the structure 500-3 having a generally constant resistivity and the structure 600-2 having a resistivity that increases from that of the region 500-3 to a higher resistivity along the direction from left to right in FIG. 6.

Figure 7:
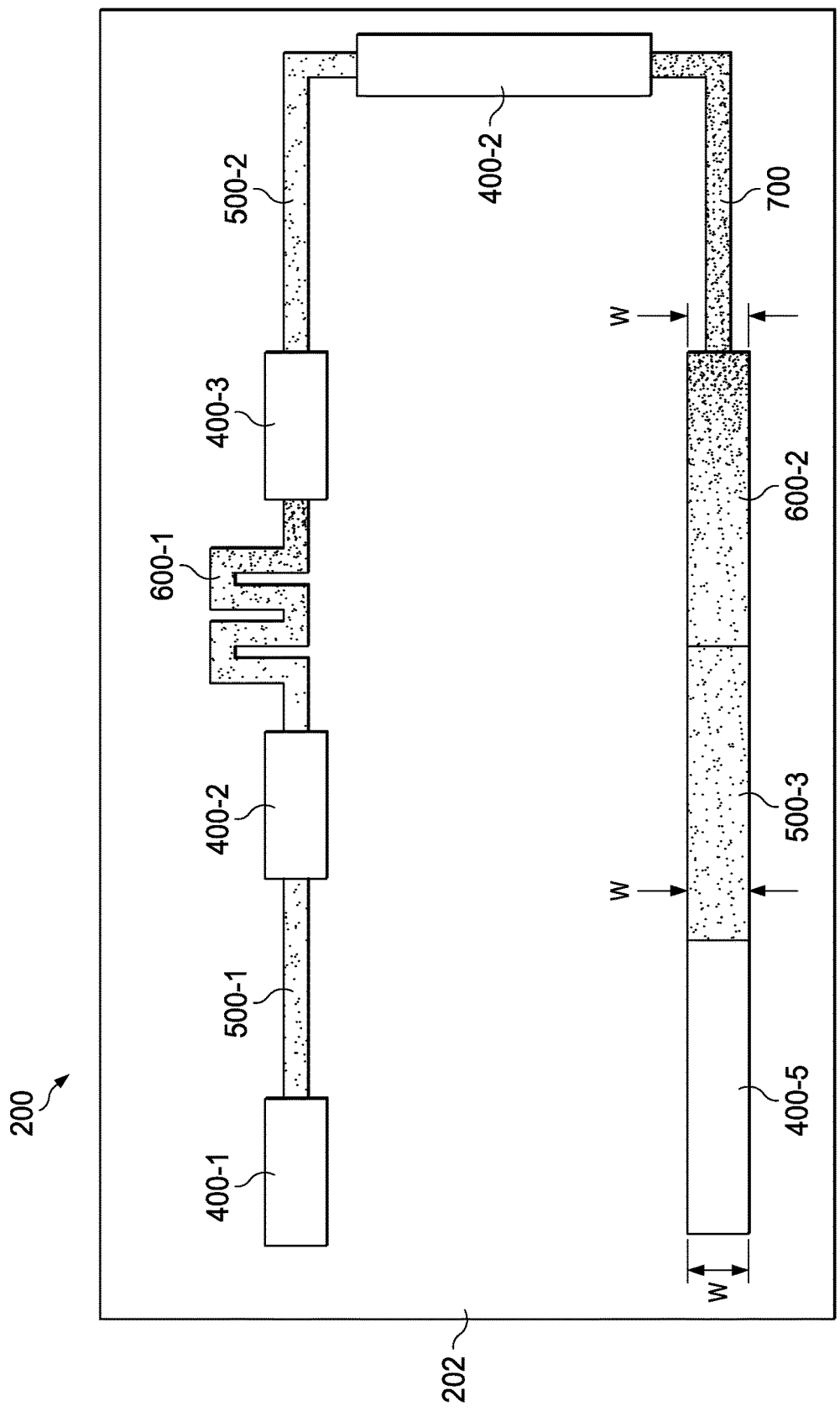
FIG. 7 is a partial top plan view of the integrated circuit of FIGS. 2-6 following illumination of further portions of the deposited metallic nanoparticle material at a still lower power level to form higher impedance resistive structures.

Referring also to FIG. 7, the processing 108 in FIG. 1 can include further illumination steps at any number of different applied energy levels, with or without gradual transitions of applied energy as desired. In the example of FIG. 7, a further resistive structure 700 is formed by illuminating a portion of the deposited metallic nanoparticle material 202 to create a further resistive structure or feature 700 electrically connected between the conductive structure 400-2 and the high resistivity end of the gradient resistive structure 600-2. In this example, the resistive structure 700 has a resistivity higher than the previously formed resistive structures 500, 600. In other examples, the processing can be performed in stepwise fashion to illuminate different spatial portions one after another. In further examples, an illumination source (e.g., laser) can be actively controlled with respect to scan rate and/or power level, while performing raster or other type scanning across the surface of the deposited material 202 to implement any desired patterned circuitry including at least one conductive structure and at least one resistive structure.

Figure 8:
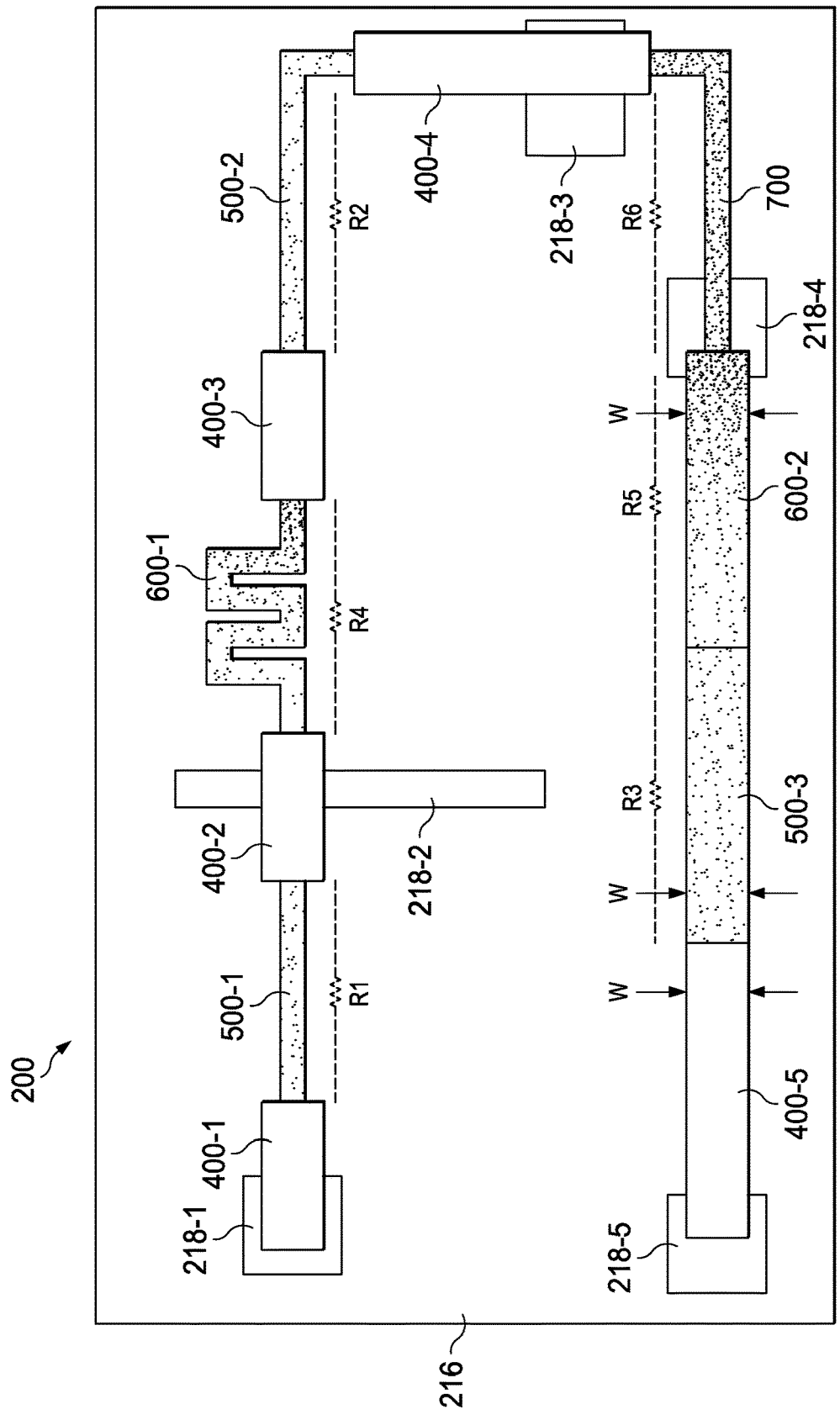
FIG. 8 is a partial top plan view of the integrated circuit of FIGS. 2-7 following removal of non-illuminated portions of the deposited metallic nanoparticle material.

FIG. 8 shows a top view of the integrated circuit 200 following optional removal at 118 in FIG. 1 of non-illuminated portions of the deposited metallic nanoparticle material 202, leaving the fabricated conductive structures 400 and resistive structures 500, 600 and 700 to provide a desired circuit pattern. Certain of these metallization structures are electrically connected to underlying contact conductive structures 218-1, 218-2, 218-3, 218-4 and 218-5. In this example, the resulting circuit resistances provided by the first resistive structures 500-1, 500-2 and 500-3 are schematically shown in FIG. 8 as resistors R1, R2 and R3. The resistances associated with the gradient resistive structures 600-1 and 600-2 are shown as resistors R4 and R5. The final resistive structure 700 is schematically shown as a resistor R6. As shown in FIG. 8, the resulting circuit configuration provides an initially conductive portion 400-5 connected to the contact structure 218-5, with increasing resistance by series connection of the resistive structure 500-3 and then the gradient resistive structure 600-2, which is electrically connected to the contact structure 218-4. The process 100 continues at 120 with other backend processing and packaging. The non-illuminated nanoparticle material 202 is not removed in certain examples, thereby leaving the surface including illuminated and non-illuminated portions, which may provide an invisible circuit with the different portions being visually indistinguishable. Examples include integrated circuit devices or other circuit structures for end use applications, where the processed material 202 is formed on an external surface. In such examples, the removal processing at 118 in FIG. 1 can be omitted.

Figure 9:
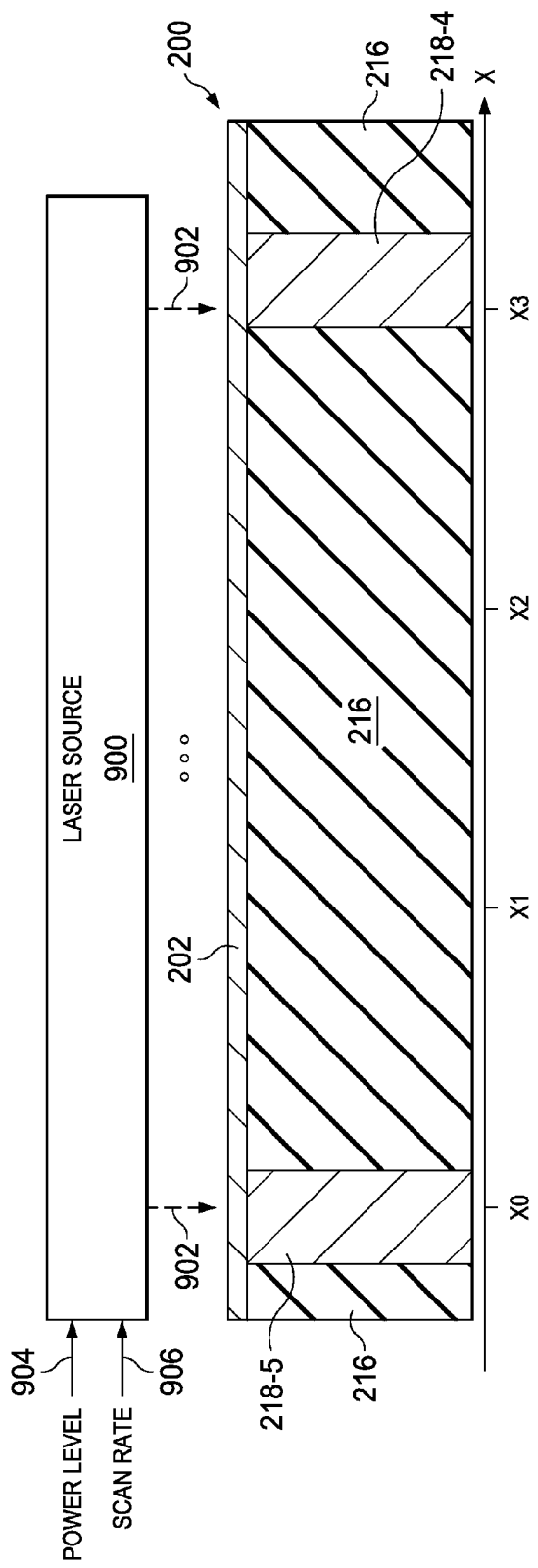
FIG. 9 is a partial side elevation view of selective illumination processing of the integrated circuit of FIGS. 2-8 using a laser source with adjustable power level and constant scan rate.
Figure 10:
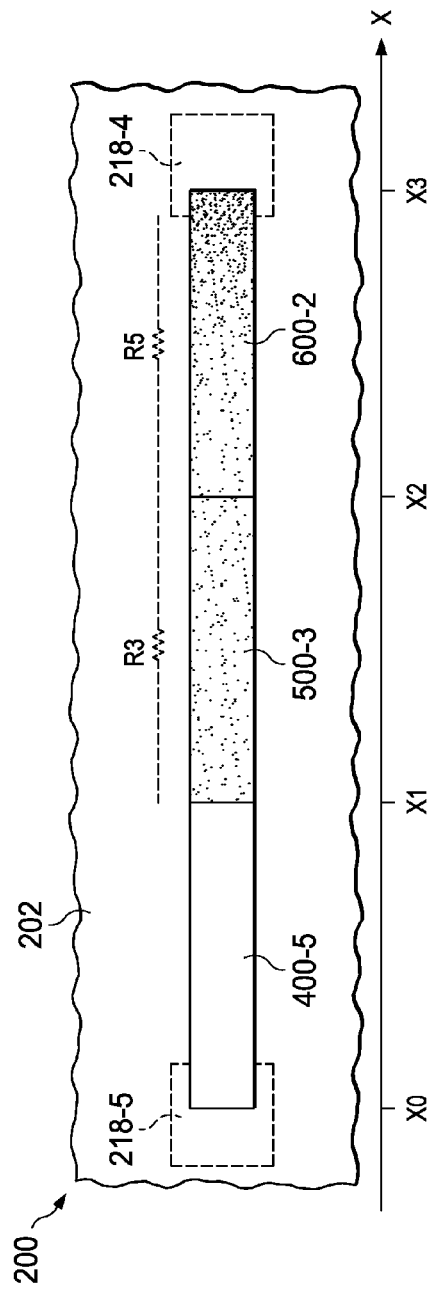
FIG. 10 is a partial top plan view of conductive, resistive, and gradient resistive structures formed along a lateral direction using the constant scan rate, variable power illumination processing of FIG. 9.

FIG. 9 shows one example illumination processing configuration, which can be employed at 112-116 in FIG. 1. A laser illumination source 900 is operable to scan light 902 across the upper surface of the deposited metallic nanoparticle material 202 of the integrated circuit device 202. The laser 900 is operable according to a controllable power level input 904 or a controllable scan rate input 906. FIG. 10 shows a partial top plan view of the IC 210 before removal of the deposited nanoparticle material 202. FIG. 10 shows the illuminated portions 400-5, 500-3 and 600-2, including the underlying contact structures 218-5 and 218-4 shown in dotted lines. As shown in FIGS. 9-12, the first illuminated portion 400-5 extends along a lateral (X) direction from X0 through X1, the second illuminated portion 500-3 extends from X1 through X2, and the third illuminated portion 600-2 extends from X2 through X3.

Figure 11:
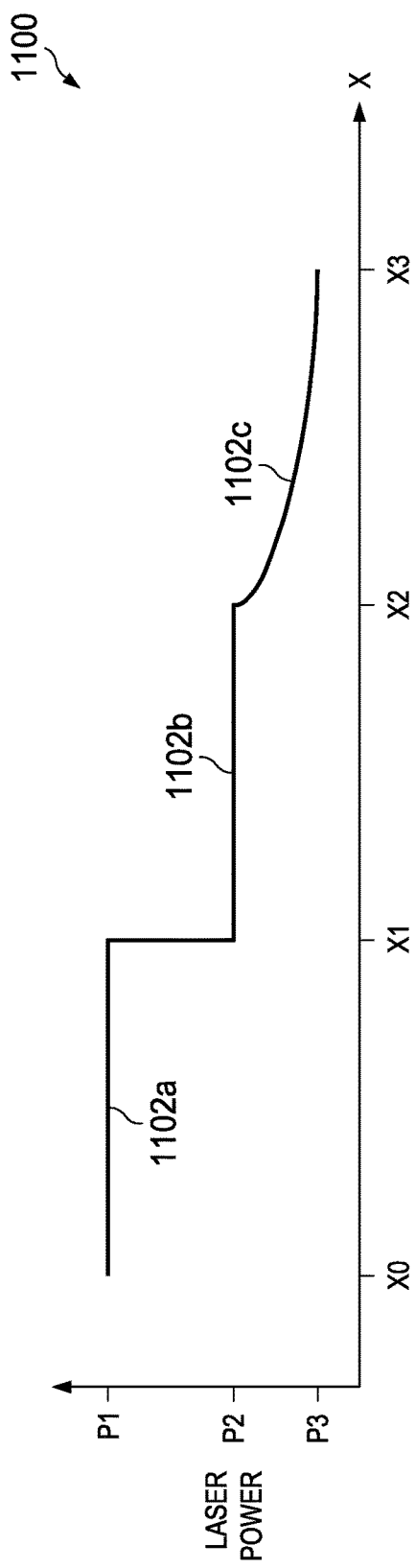
FIG. 11 is a graph of laser power along the lateral direction to form the successive conductive, resistive and gradient resistive structures of FIG. 10.
Figure 12:
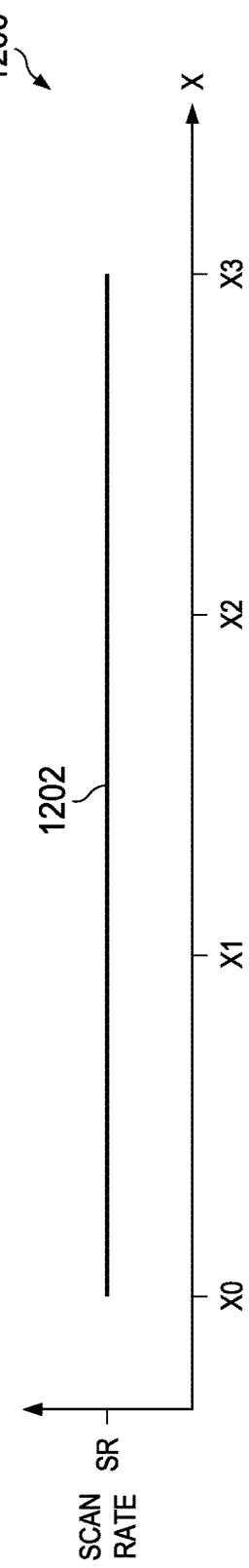
FIG. 12 is a graph of laser scan rate along the lateral direction to form the conductive, resistive and gradient resistive structures of FIG. 10.

FIG. 11 shows a graph 1100 including a curve 1102 of applied laser power per unit area along the X direction. FIG. 12 shows a graph 1200 of a scan rate curve 1202 corresponding to the scanning speed or scan rate of the laser illumination source 900. In this example, the laser 900 is operated at a generally constant scan rate (SR) 1202. The associated optics of the laser system 900 is configurable to implement illumination over a controlled scan width using any suitable raster or other type scanning for directing laser light 902 toward the material 202 according to a constant scan rate input 906 (FIG. 9). Also, the changes in applied energy levels for the different illuminated portions 400-5, 500-3 and 600-2 are implemented by adjusting the power level input 904 to corresponding levels P1 shown in the graph 1100 as 1102a from X0 through X1, with a step change to a lower second-level P2 shown as 1102b from X1 through X2, and a transition to a lower third level P3 where the power level is gradually lowered along a curved profile 1102c from X2 through X3 in the illustrated example. In other implementations, a linear transition can be used in the laser power level 1102, or stepwise linear profiles can be used, or curvilinear profiles can be used, or combinations thereof. In this manner, the laser 900 scans light 902 across the illuminated portions 400-5, 500-3 and 600-2 at a steady scan rate with adaptive adjustments to the power level via the control input 904 to implement the laser power profile 1102 shown in the graph 1100. By this operation, the method 100 provides different applied energy levels to the different portions 400-5, 500-3 and 600-2, corresponding to control of the sintering and hence conductivity change of the deposited material 202.

Figure 13:
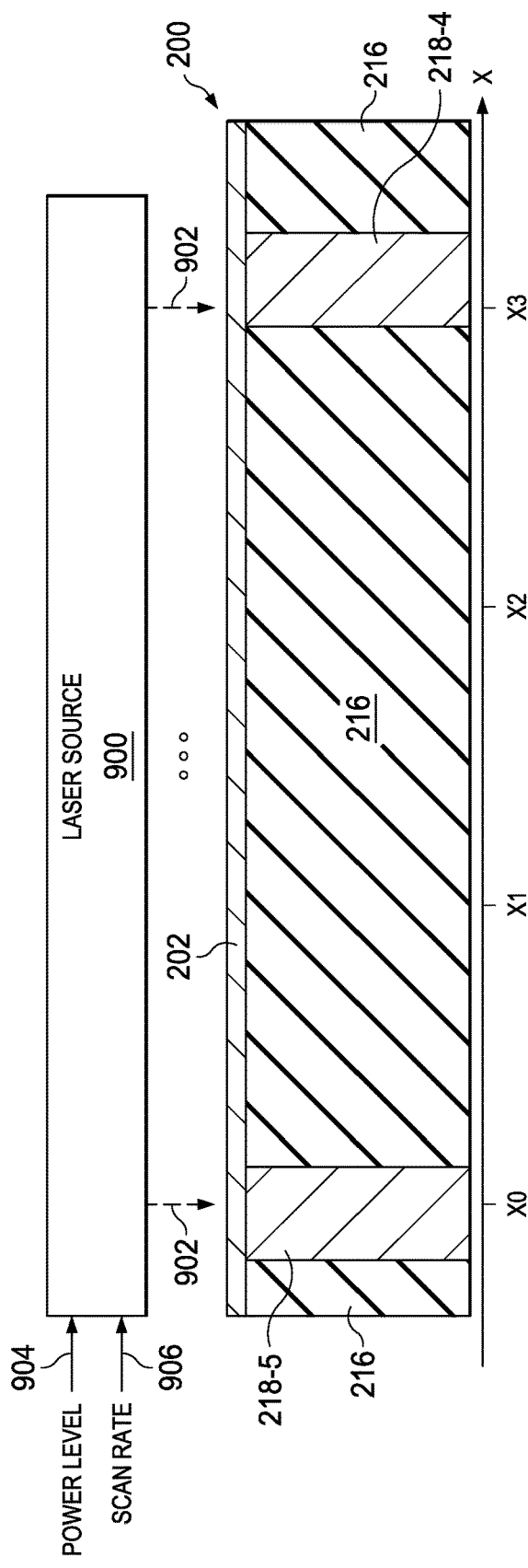
FIG. 13 is a partial side elevation view of selective illumination processing of the integrated circuit of FIGS. 2-8 using a laser source with adjustable scan rate at a constant laser power level.
Figure 14:
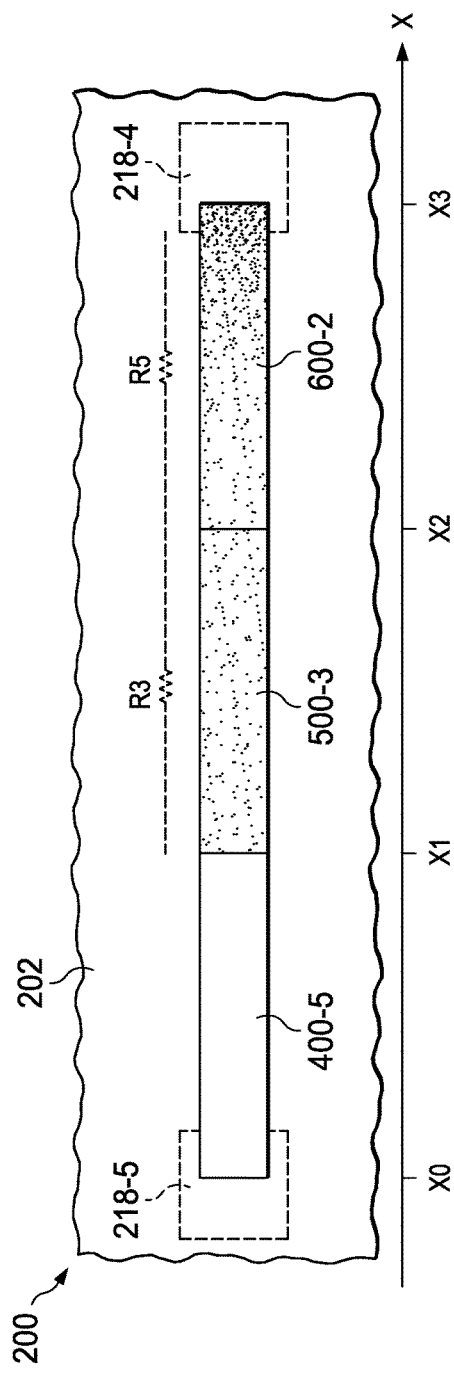
FIG. 14 is a partial top plan view of conductive, resistive, and gradient resistive structures formed along a lateral direction using the constant power, variable scan rate illumination processing of FIG. 13.
Figure 15:
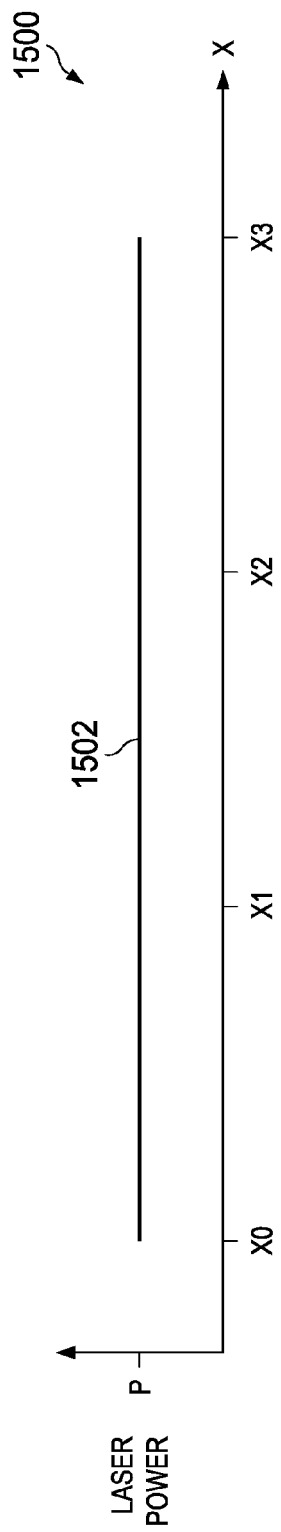
FIG. 15 is a graph of constant laser power along the lateral direction to form the conductive, resistive and gradient resistive structures of FIG. 14.
Figure 16:
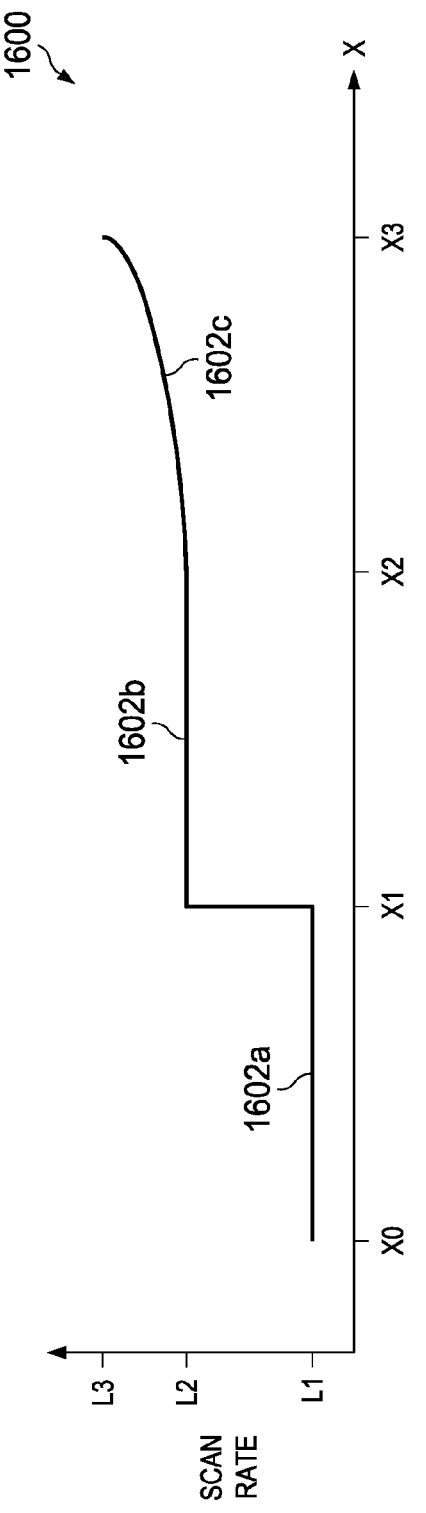
FIG. 16 is a graph of laser scan rate adjusted along the lateral direction to form the conductive, resistive and gradient resistive structures of FIG. 14.

FIGS. 13-16 illustrate another non-limiting example in which the scan rate SR of the laser source 900 is adapted via the scan rate input 906 while operating at a generally constant power level input 904 to provide the selective application of different applied energy levels to the portions 400-5, 500-3 and 600-2. FIG. 13 shows the laser source 900 selectively illuminating portions of the metallic nanoparticle material 202, and FIG. 14 illustrates the portion of the IC 200 including the conductive feature 400-5 and resistive features 500-3 and 600-2 as in FIG. 10. The graph 1500 in FIG. 15 shows a generally constant laser power level curve 1502 at a level P as the laser 900 scans from X0 through X3. FIG. 16 shows a graph 1600 with a curve 1602 showing the scan rate at a low level L1 from X0 through X1 (curve portion 1602a in FIG. 16), followed by a higher level L2 from X1 through X2 (1602*b*), after which the scan rate is gradually increased from L2 to a higher rate L3 along a curved profile 1602*c* while the laser 900 scans light 902 across the IC 200 from X2 through X3 for gradual increase in the resistivity of the gradient resistive feature 600-2.

The method 100 facilitates varying the sheet resistance (ohms/square) of a metallization layer for an integrated circuit, printed circuit board or other circuit structure using a single material 202 and selective illumination processing in a patterned manner to achieve gradient resistivity metallization layers and construction of any desired conductive and resistive traces and features. While illustrated and described in constructing one-dimensional conductive and resistive structures 400-5, 500-3, 600-2, the process 100 and the metallization processing 108 can form two-dimensional resistive and conductive structures. For example, the gradient resistor structure 600-1 is made by selective illumination control to provide graduated resistivity in the illuminated portion, and geometric patterning is also used to form a meandered structure shape in two dimensions. Further, these techniques 108 can be used in three-dimensional configurations.

The process 100 of FIG. 1 uses illumination of the material 202 with a laser 900. In other examples, other energy sources are used for selectively sintering the nanoparticle material 202 to control the material resistivity in a patterned fashion. The conductivity increases because of nano-scale low-temperature melting experienced in nano-scale particles of the deposited material 202, as a result of selective exposure to energy through laser scanning. Because the conductivity per unit area is proportional to the amount of energy absorbed, the laser 900 can be scanned over the material layer 202 with a patterned intensity to vary the conductivity across the surface. Using this method, a seemingly continuous metal sheet can actually have patterned insulating, resistive, and conducting areas, which are not visually perceptible in some examples if the non-illuminated portions are not removed.

Figure 17:
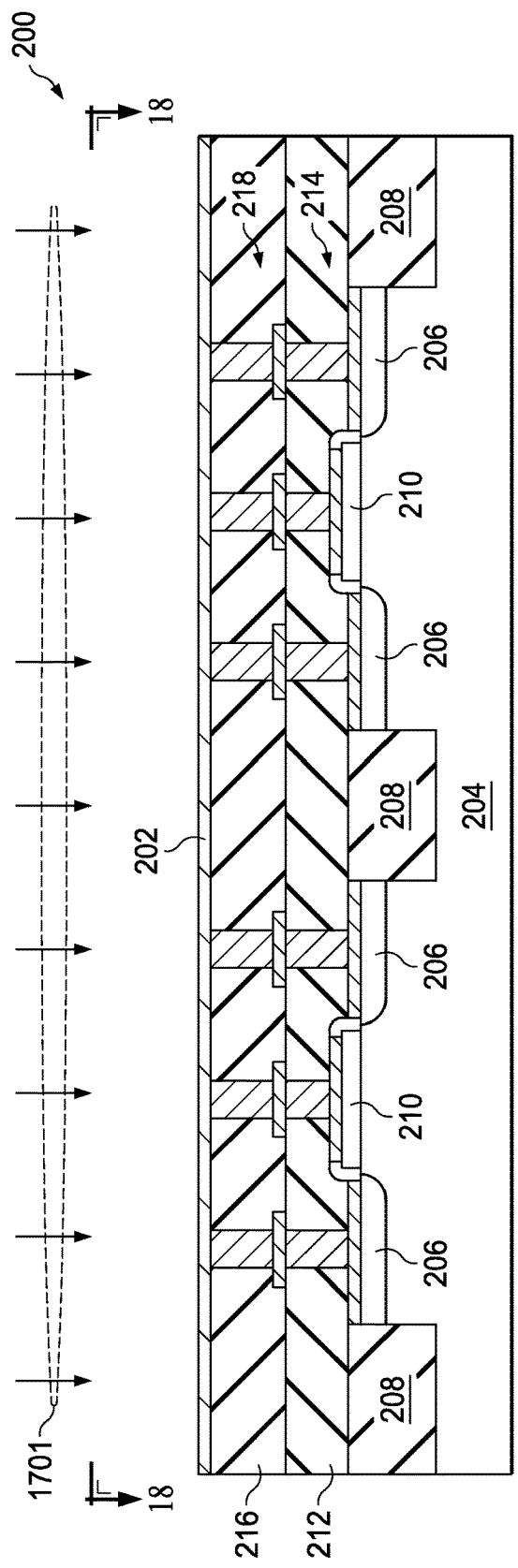
FIG. 17 is a partial side elevation view of the integrated circuit undergoing a second additive deposition process to selectively form metallic nanoparticle material on select portions of the upper interlayer dielectric material.
Figure 18:
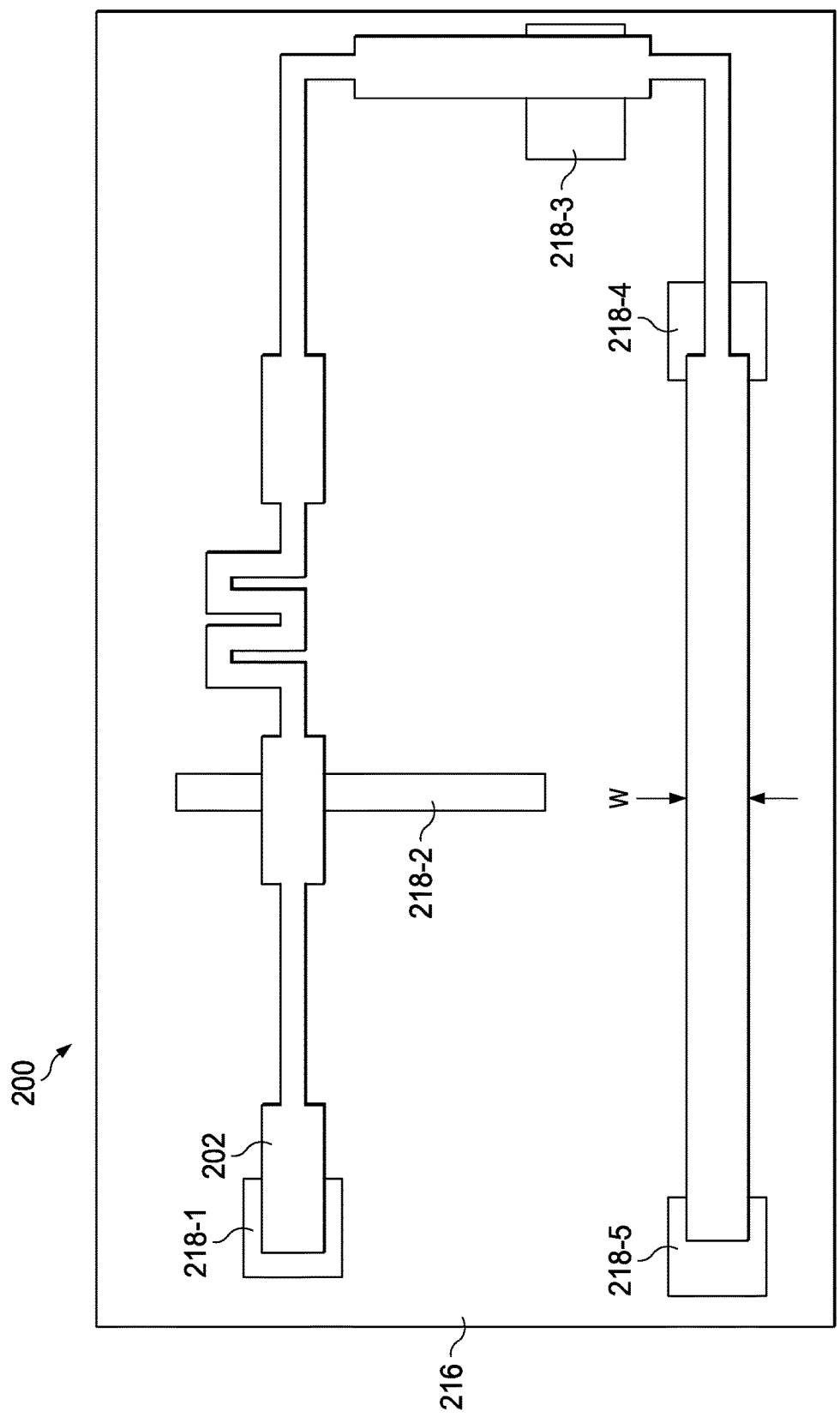
FIG. 18 is a partial top plan view of the integrated circuit of FIG. 17 following the selective deposition of the metallic nanoparticle material layer.
Figure 19:
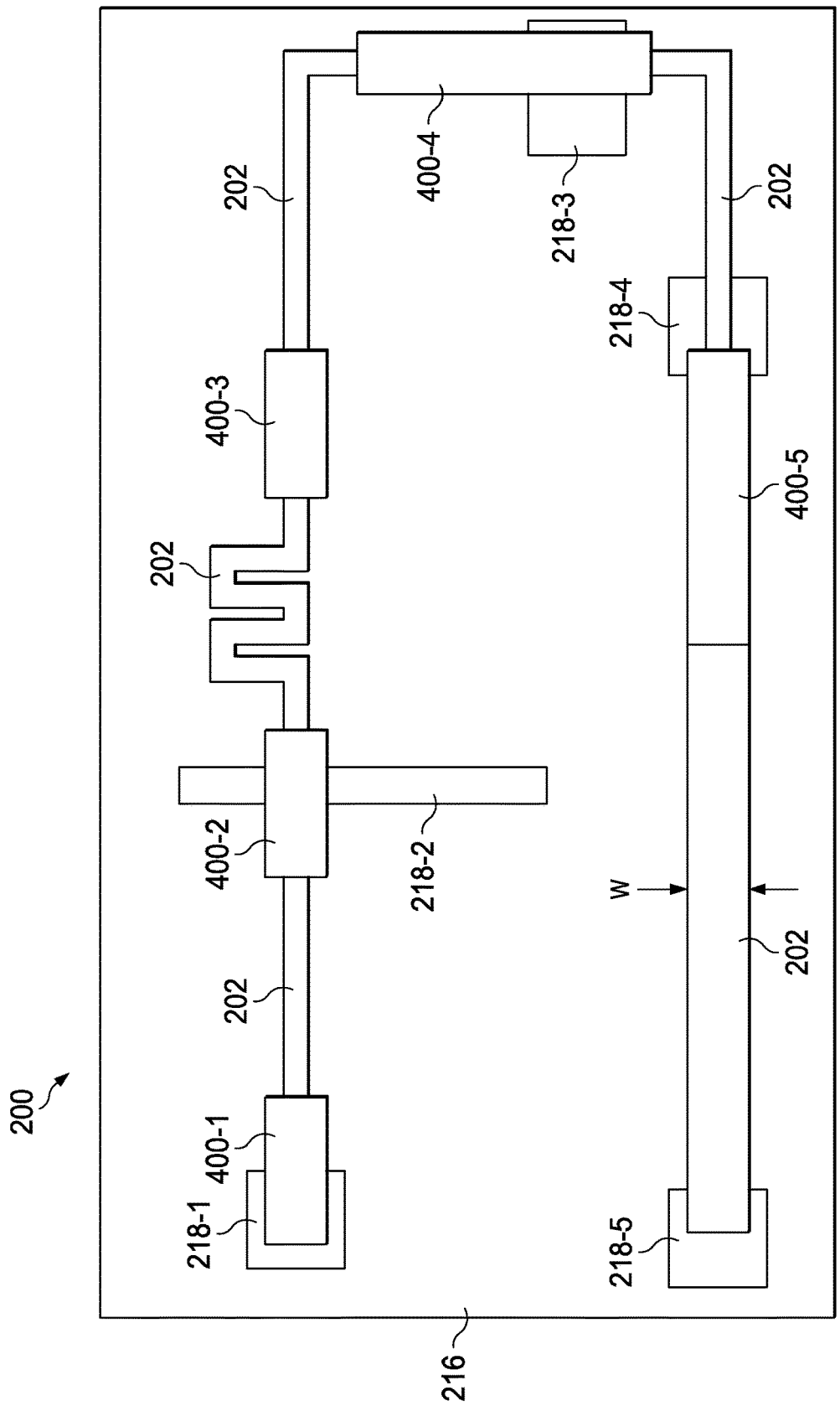
FIG. 19 is a partial top plan view of the integrated circuit of FIGS. 17 and 18 following illumination of first portions of the deposited metallic nanoparticle material at a first applied energy level to create conductive circuit structures.
Figure 20:
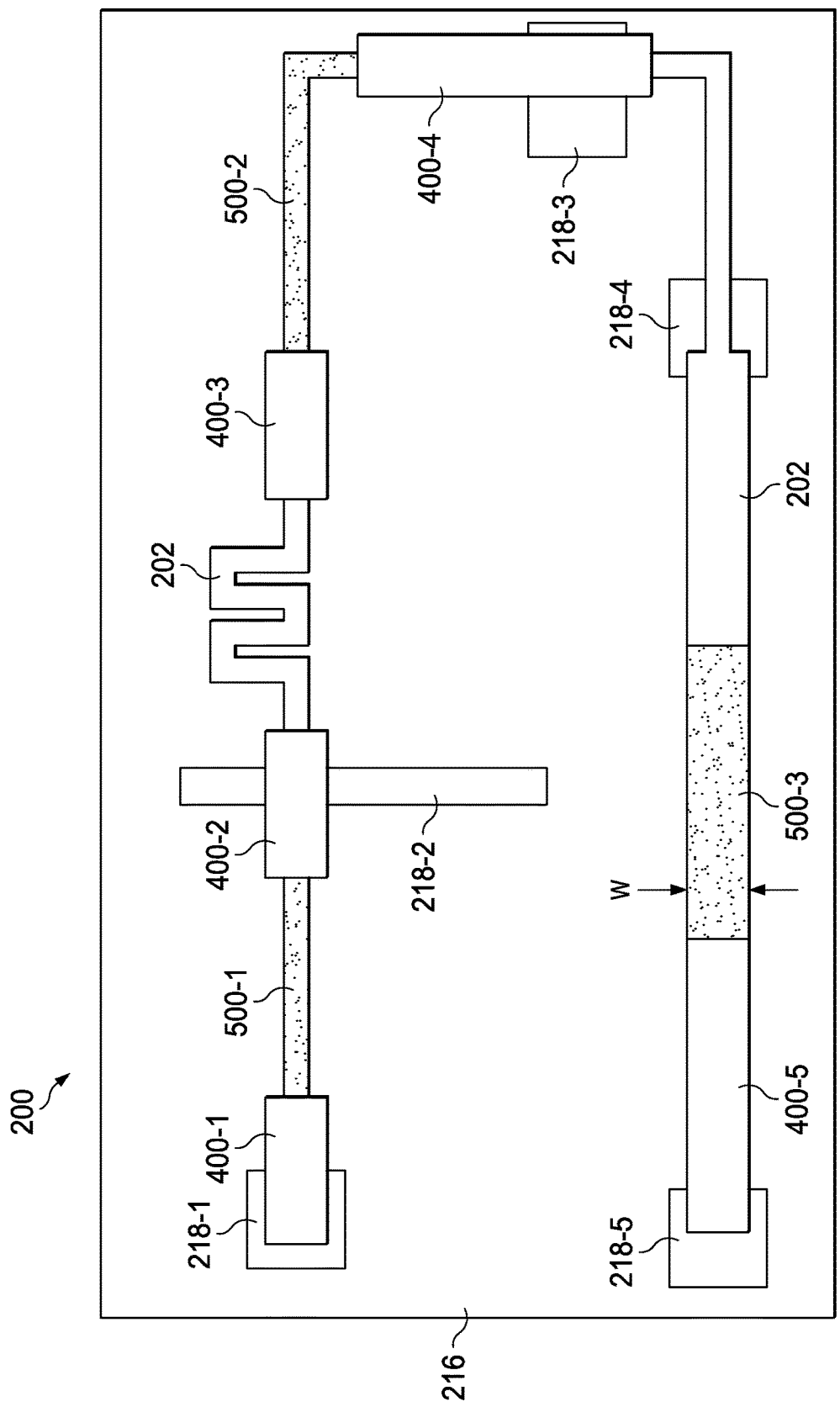
FIG. 20 is a partial top plan view of the integrated circuit of FIGS. 17-19 following illumination of second portions of the deposited metallic nanoparticle material at a lower second applied energy level to create resistive circuit structures.
Figure 21:
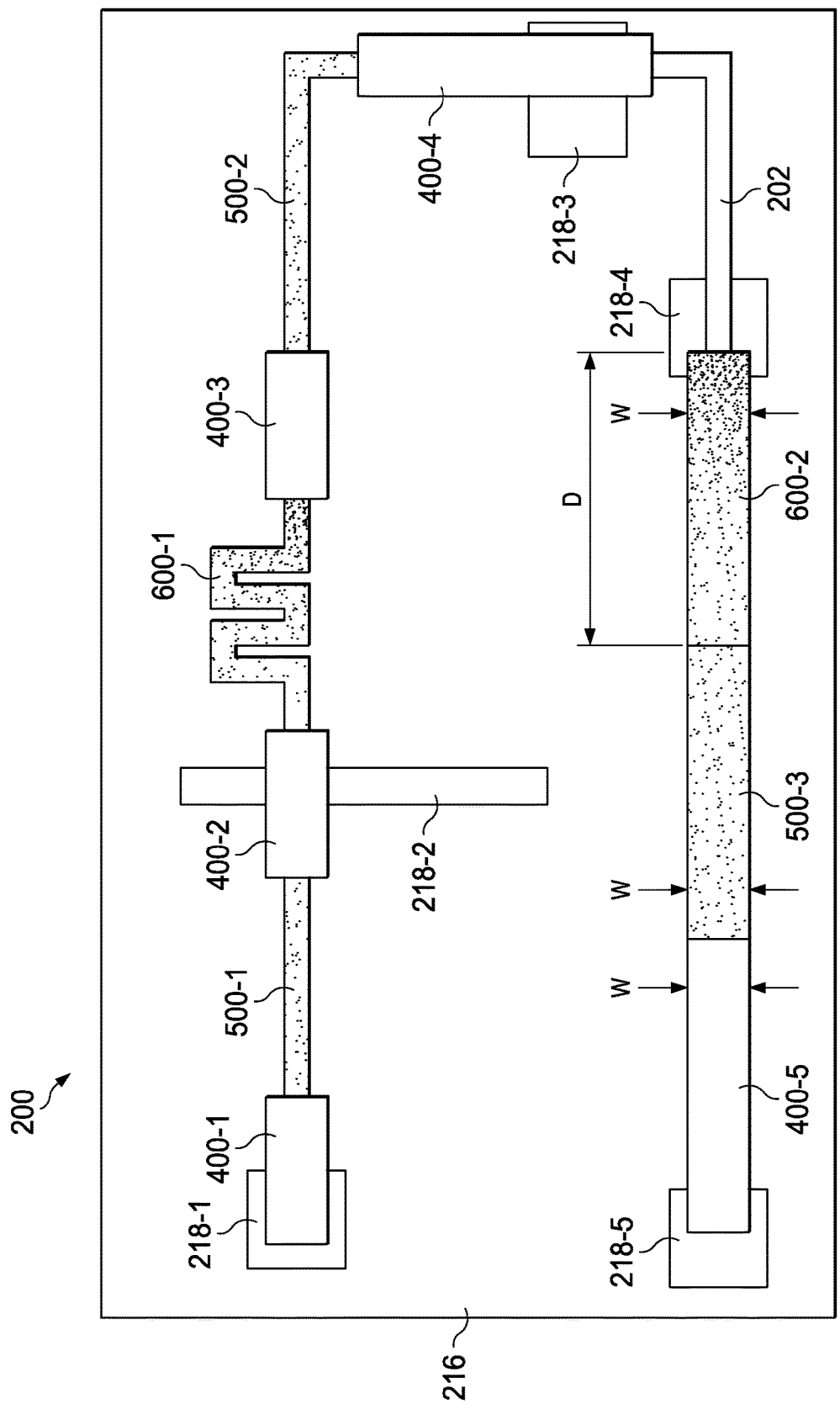
FIG. 21 is a partial top plan view of the integrated circuit of FIGS. 17-20 following tapered power and/or scan rate illumination of further portions of the deposited metallic nanoparticle material to form gradient resistive circuit structures.
Figure 22:
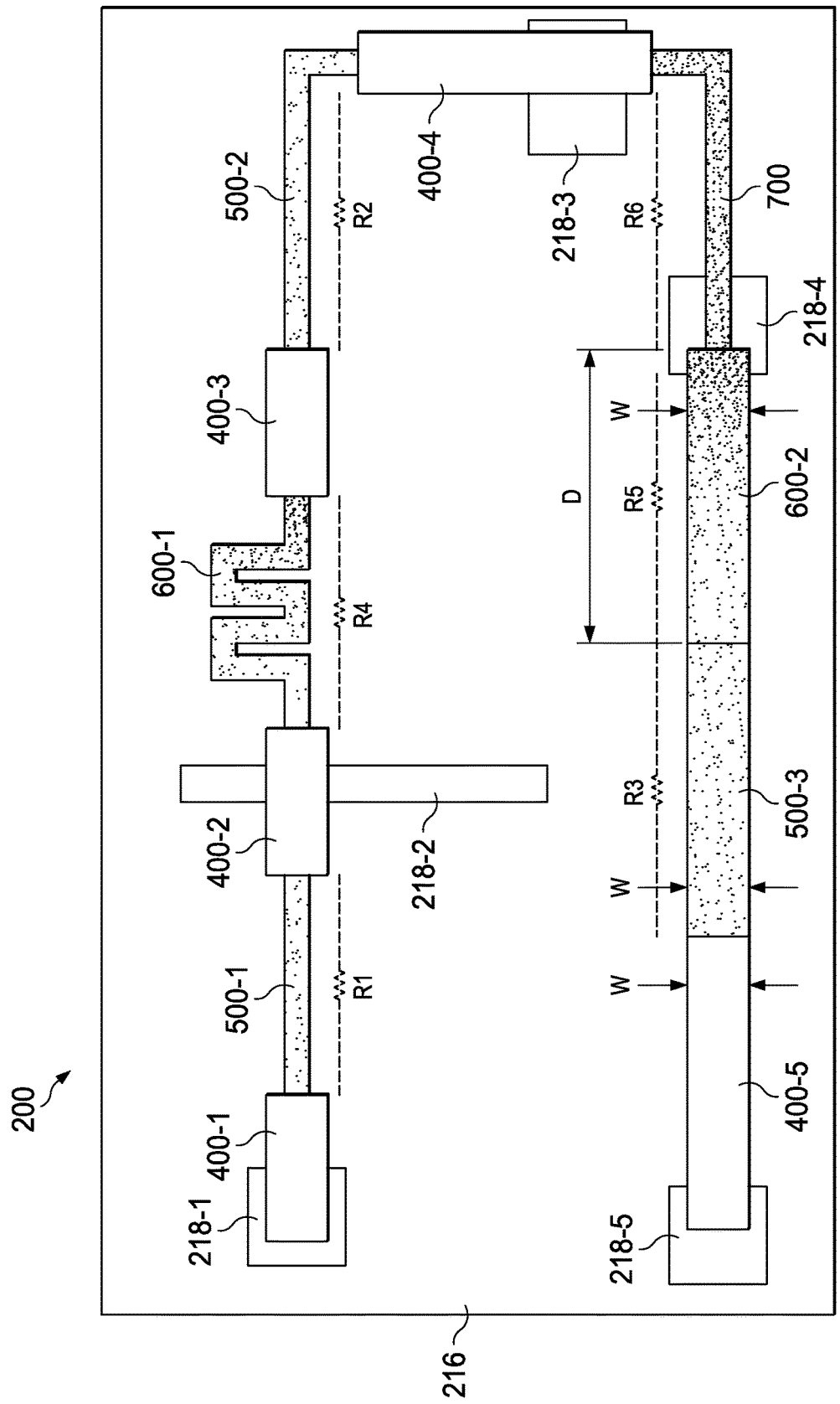
FIG. 22 is a partial top plan view of the integrated circuit of FIGS. 17-21 following illumination of further portions of the deposited metallic nanoparticle material at a still lower power level to form higher impedance resistive structures.

Referring to FIGS. 1 and 17-22, the material 202 may alternatively be deposited in a patterned manner on the dielectric 216 (110 in FIG. 1) using an additive deposition process 1701 in FIG. 17, such as inkjet, screen, gravure, or flexographic printing to reduce material usage. Impedance patterning is performed (e.g., 112-116 in FIG. 1) over the pre-patterned material layer 202 to make the traces conductive, resistive, or gradient resistive for forming conductive and resistive features 400, 500, 600 and 700. In one example, a global deposition is used at 110, followed by selective etching to remove deposited material 202 to provide a patterned material 202 over the dielectric layer 216 and any exposed conductive features 218 as shown in FIG. 18. FIG. 19 shows the IC 200 following selective illumination of the desired conductive portions 400 using the same desired circuit and pattern illumination described above in connection with FIGS. 4-8. FIG. 20 shows subsequent selective illumination to form the first resistive structures 500. FIG. 21 shows subsequent controlled illumination to form the gradient resistive structures 600, and FIG. 22 shows the finished IC 200 following selective illumination to form the additional resistive structure 700.

In FIGS. 8 and 22, an integrated circuit 200 or printed circuit board includes at least one conductive structure having an electrical resistivity (e.g., structures 400) formed from a first material 202 on a surface layer or other planar structure (e.g., dielectric layer 216 and any exposed contact structures 218). The integrated circuit 200 also includes a first resistive structure 500 formed from the same material 202 on the planar structure 216 with a resistivity greater than the conductive structure electrical resistivity. The IC 200 also includes a second resistive structure (e.g., resistive structure 700) formed from the same material 202 on the planar structure 216 with an electrical resistivity greater than that of the first resistive structures 500. The IC 200 includes at least one gradient resistive structure 600-2 formed from the same material 202, which extends along a length D from a first end to a second end, and has an electrical resistivity profile that varies along the length distance D. In certain examples, the gradient electrical resistivity profile varies continuously along the length distance D, such as in the structure 600-2 of FIGS. 8 and 22. In certain examples, the gradient resistive structure 600 is not geometrically patterned, and it may have a constant cross-sectional area along the length distance D (e.g., structure 600-2).

Figure 23:
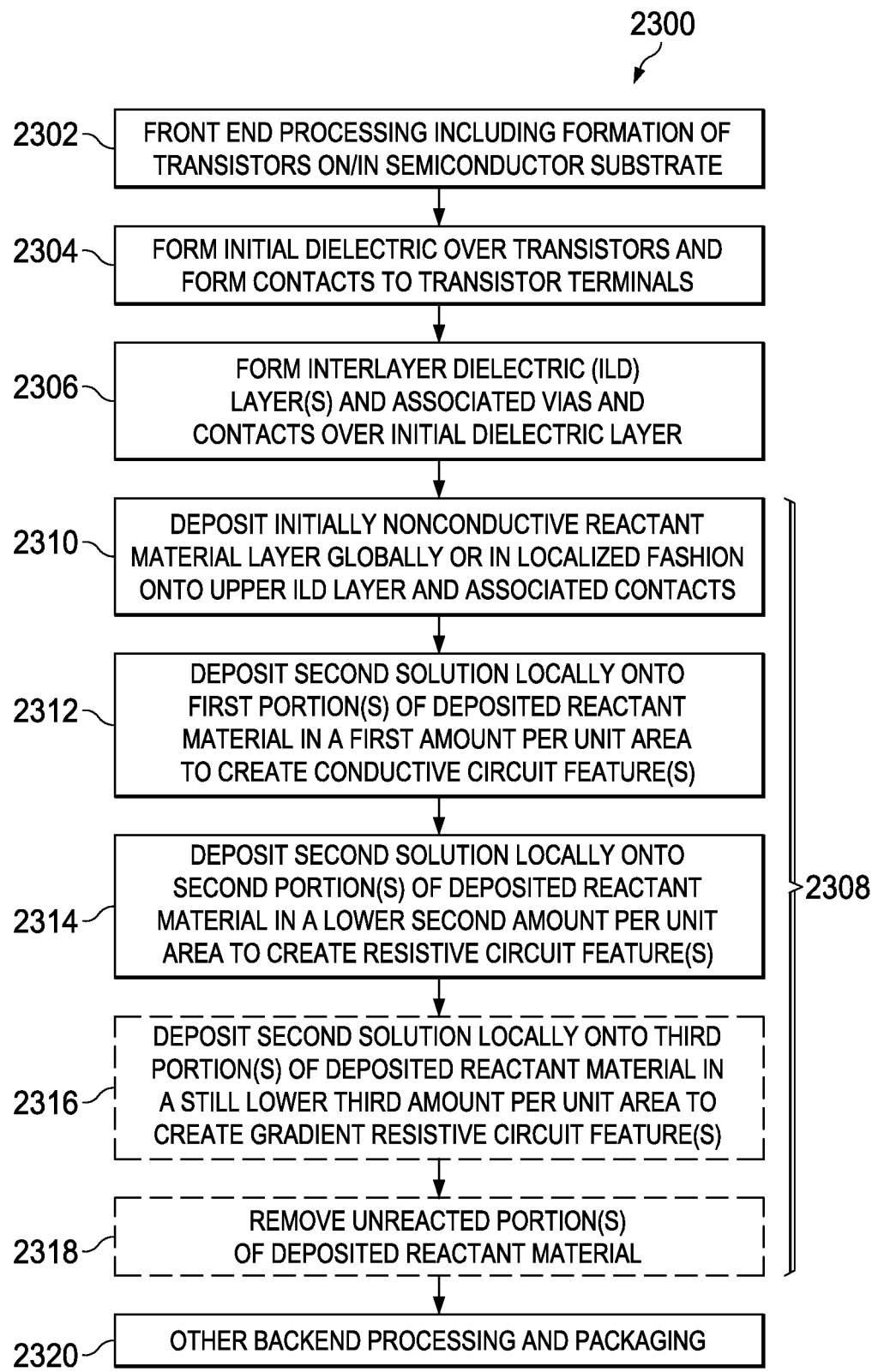
FIG. 23 is a flow diagram of a second method of forming conductive and resistive structures by variable impedance patterning using chemical reaction-based deposition in an integrated circuit.
Figure 24:
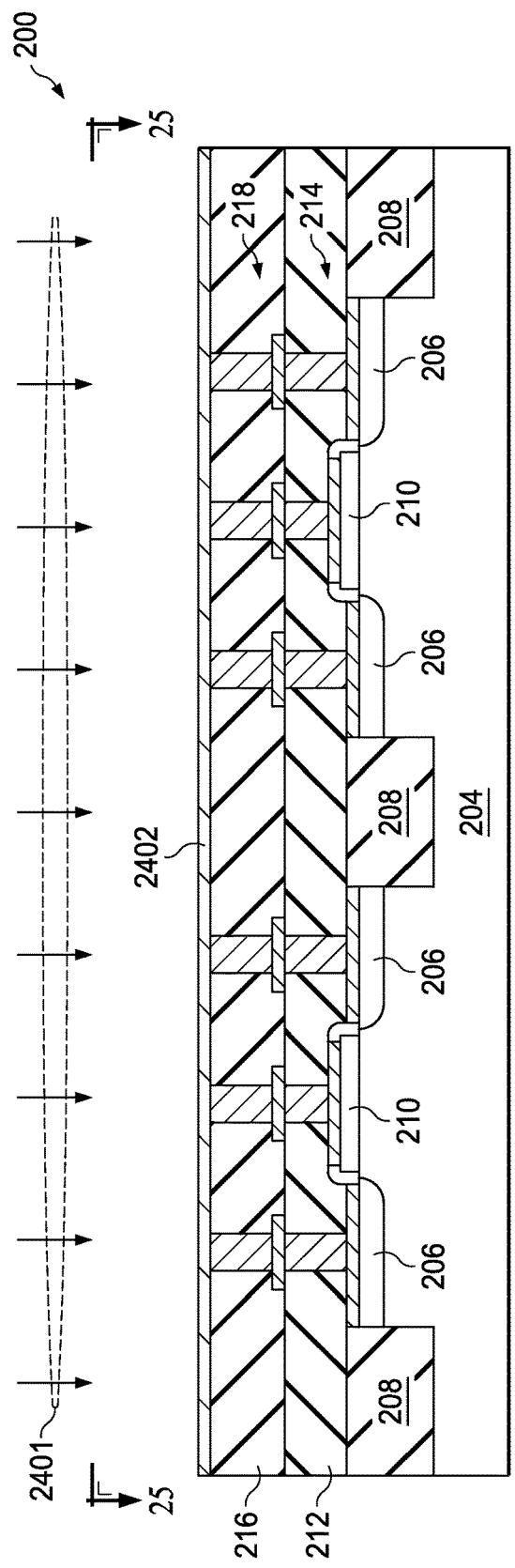
FIG. 24 is a partial side elevation view of an integrated circuit undergoing a global or selectively additive deposition process to form a reactant material on the upper interlayer dielectric material.
Figure 25:
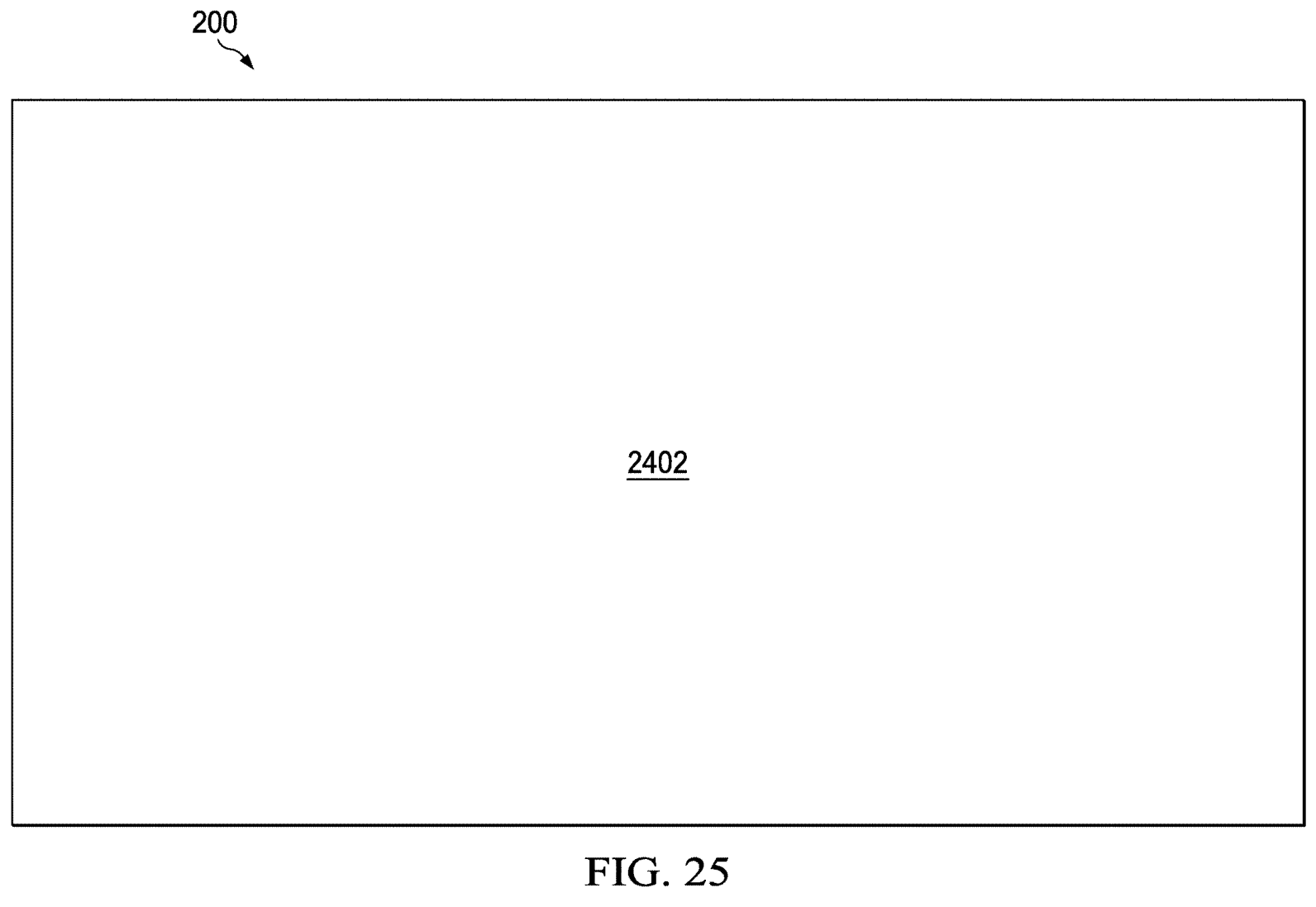

FIG. 23 shows a process or method 2300 of fabricating conductive and resistive structures in an integrated circuit 200 or on a printed circuit board using chemical reaction-based deposition. FIGS. 23-30 illustrate the integrated circuit 200 undergoing processing generally according to the method 2300. The front end processing, initial dielectric formation, and formation of one or more ILD layers are performed at 2302, 2304 and 2306 (in similar fashion to the processing at 102, 104 and 106 in FIG. 1) to provide a partially processed integrated circuit 200 in FIG. 24. Direct-writing for variable impedance patterning is performed at 2308 in FIG. 23, including deposition of an initially non-conductive reactant material 2402 at 2310 onto the upper ILD layer 216 and any associated exposed contact structures 218. The deposition is performed in one example using a deposition process 2401 as shown in FIG. 24 to form the reactant material 2402 as shown in the top view of FIG. 25. The illustrated example shows a global deposition process 2401 to form the reactant material 2402 across the entire ILD layer 216. A localized deposition process is used in other examples.

The initially deposited reactant layer 2402 is non-conductive, so it has a relatively high resistivity. At 2312, 2314 and 2316, a second solution 2404 (FIG. 31) is selectively deposited in different amounts per unit area to create conductive, resistive, and gradient resistive circuit features using any suitable selective deposition or dispensing process, such as inkjet printing in one example. Any suitable initial reactant material 2402 can be used, and it undergoes a reaction to form a more conductive layer upon mixing with the second solution 2404. Any suitable second solution 2404 can be used, which causes a selectively adjustable chemical reaction when deposited over the reactant layer 2402 in varying amounts to yield material portions with varying degrees of resistivity.

Figure 26:
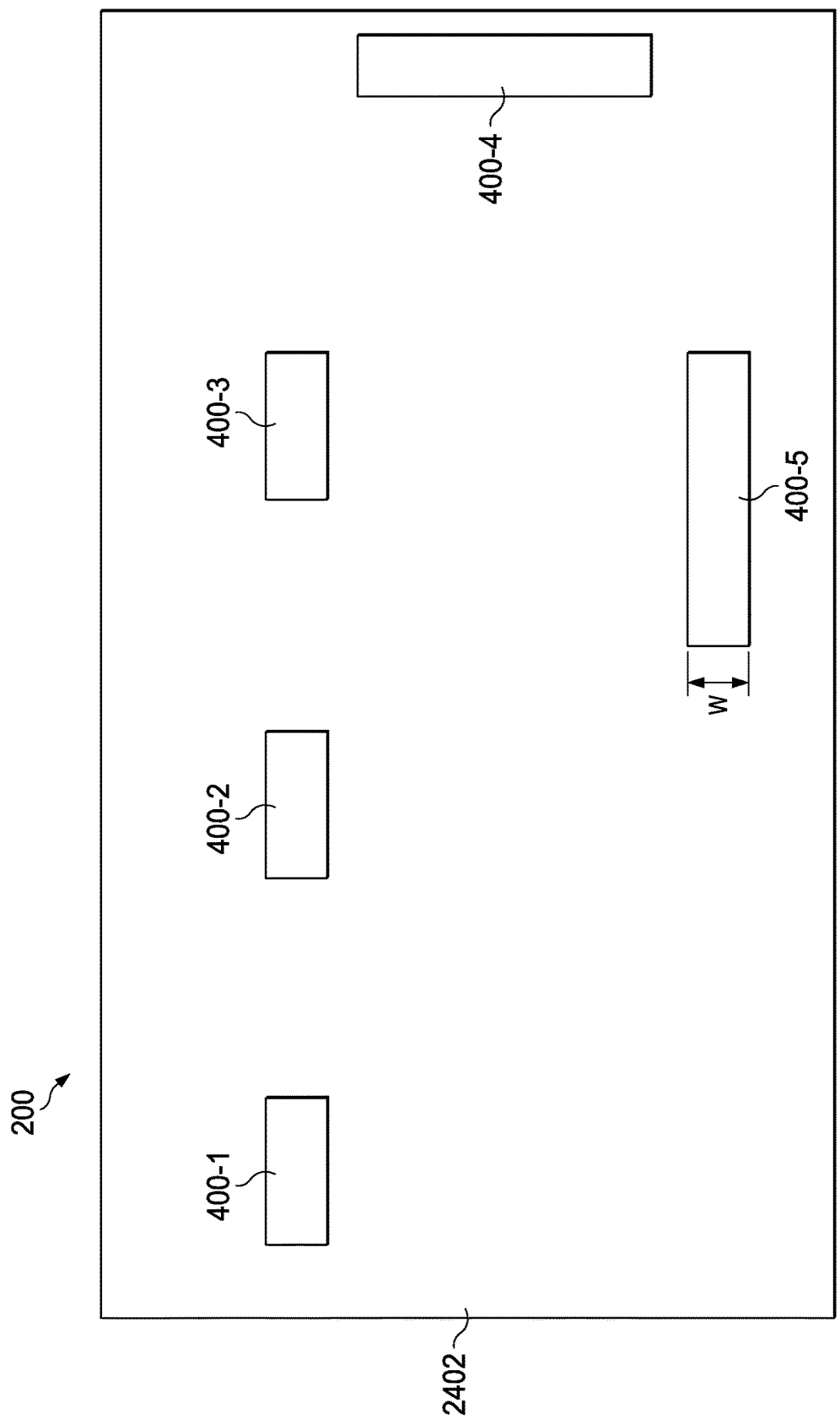
FIG. 26 is a partial top plan view of the integrated circuit of FIGS. 24 and 25 following selective additive deposition of a second solution onto first portions of the deposited reactant material at a first thickness level to create conductive circuit structures.
Figure 27:
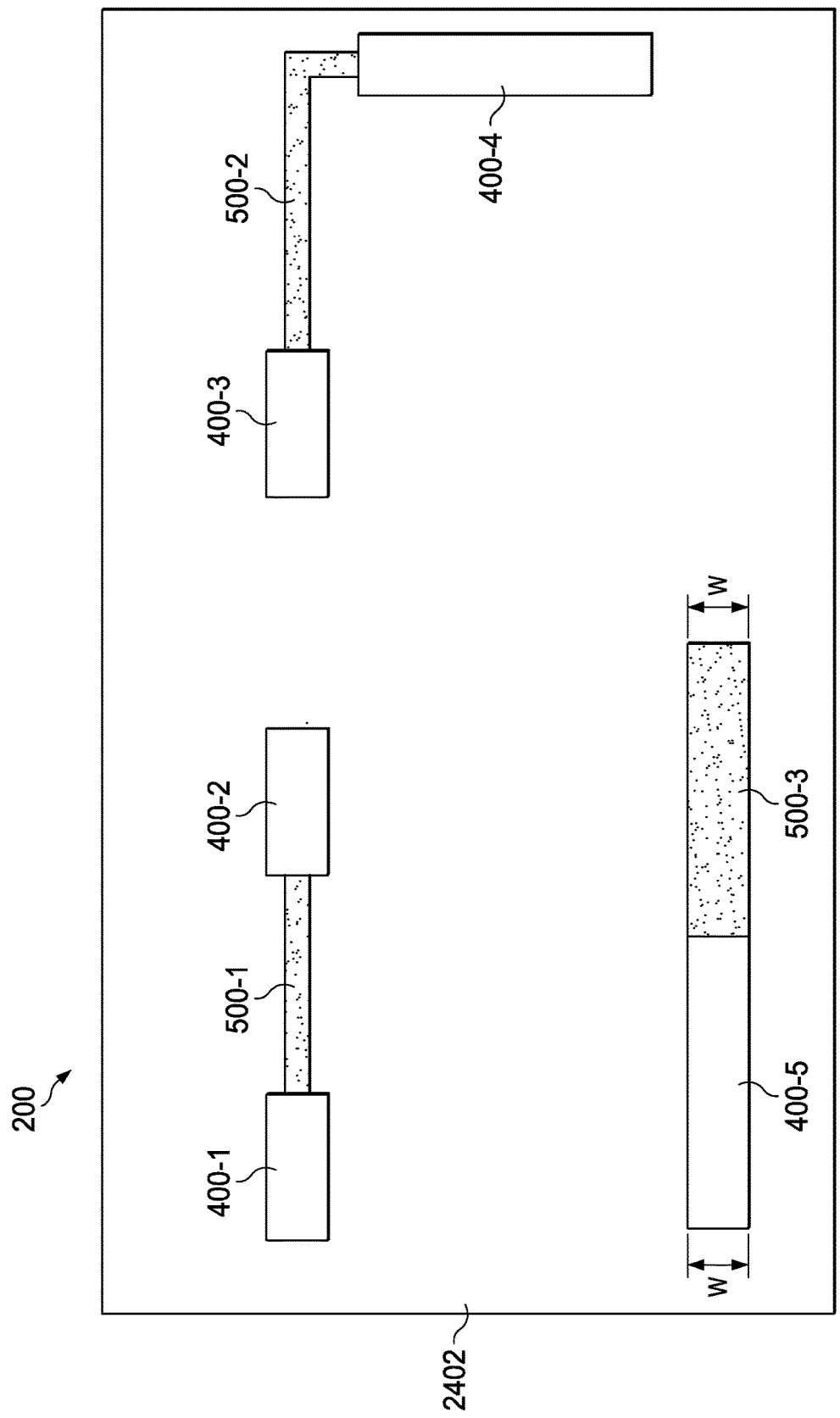
FIG. 27 is a partial top plan view of the integrated circuit of FIGS. 24-26 following selective additive deposition of the second solution onto second portions of the deposited reactant material at a lower second thickness level to create resistive circuit structures.
Figure 28:
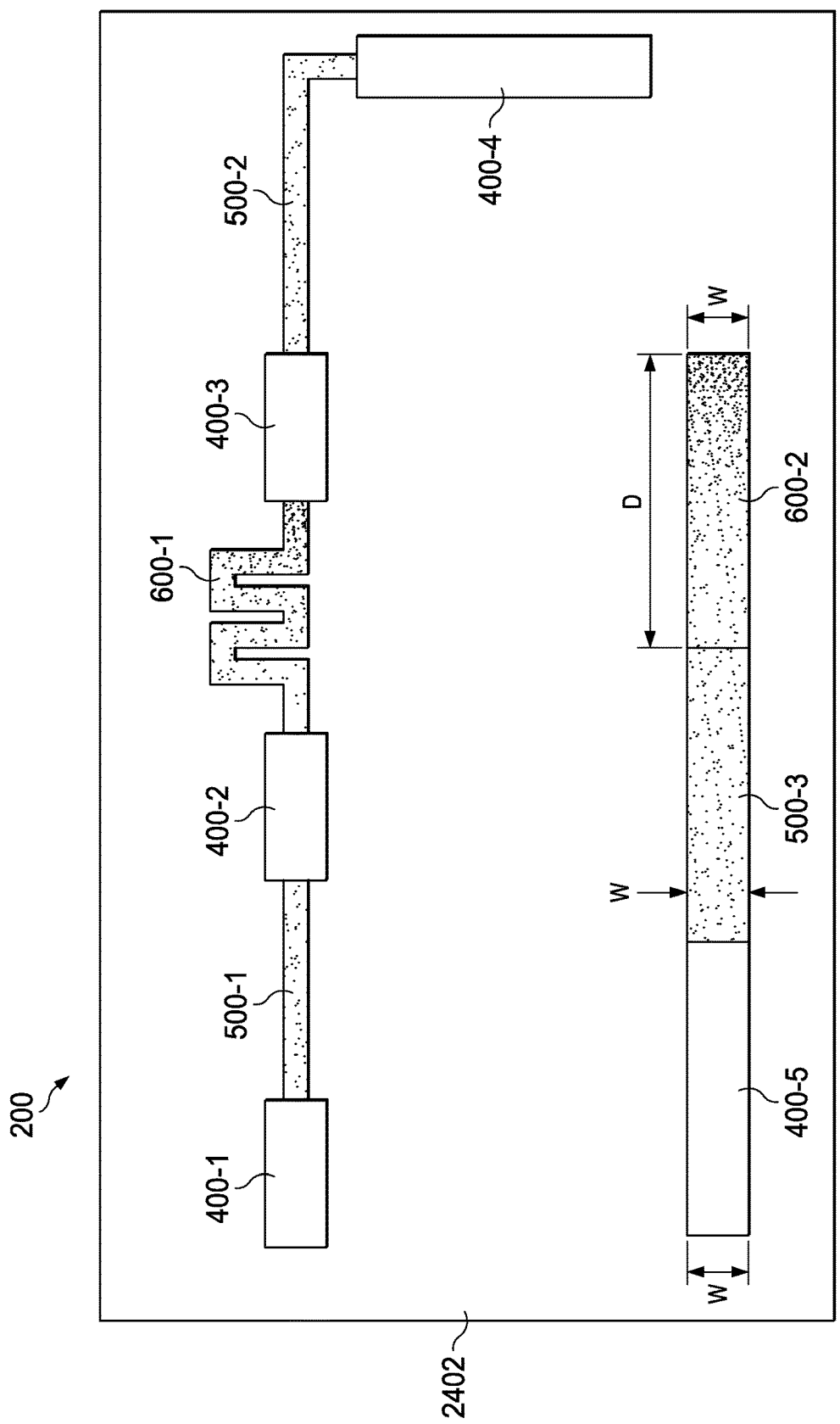
FIG. 28 is a partial top plan view of the integrated circuit of FIGS. 24-27 following tapered additive deposition of the second solution onto further portions of the deposited reactant material to form gradient resistive circuit structures.
Figure 29:
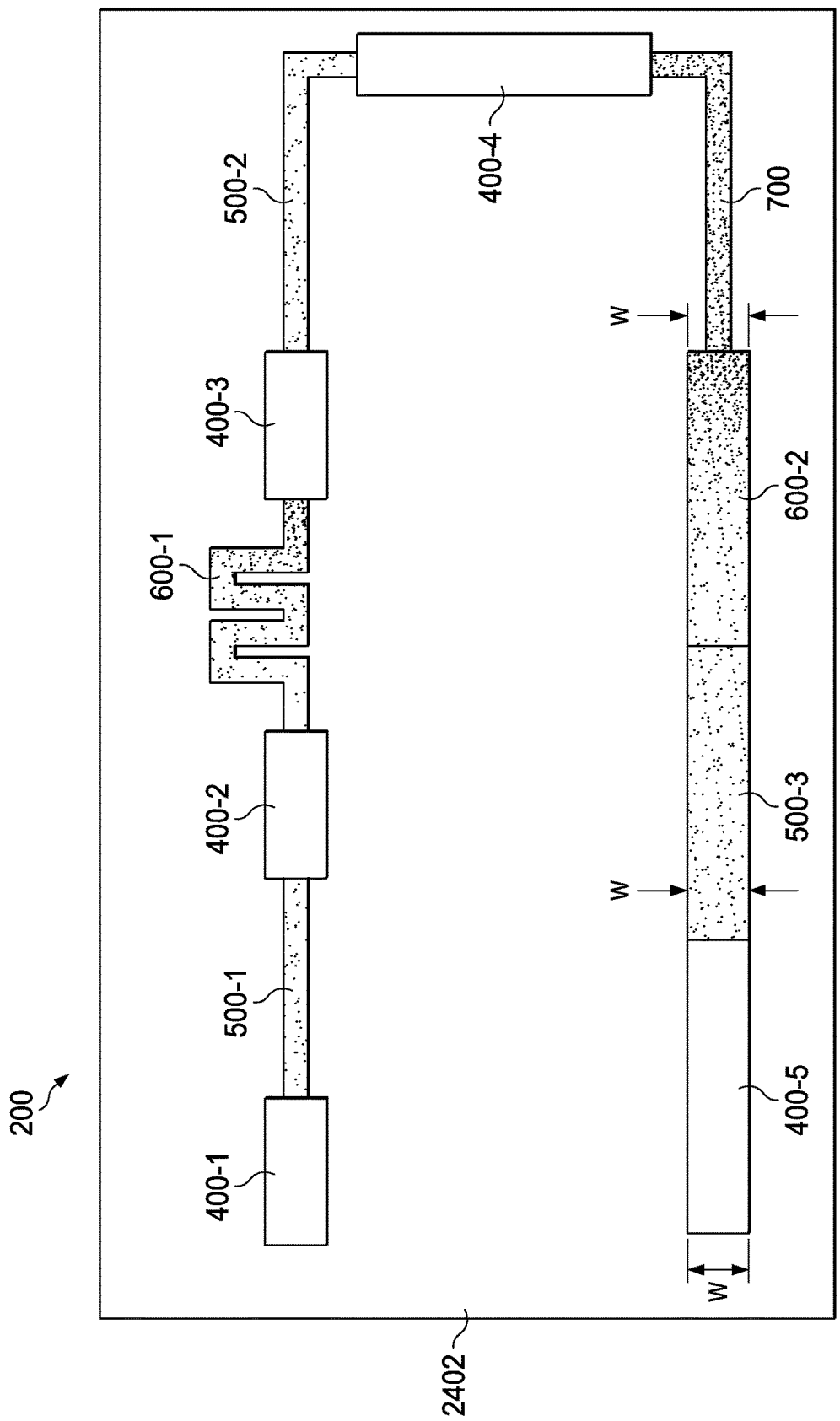
FIG. 29 is a partial top plan view of the integrated circuit of FIGS. 24-28 following selective additive deposition of the second solution onto further portions of the deposited reactant material at a lower thickness level to form higher impedance resistive structures.

At 2312 in FIG. 23, the second solution 2404 is deposited in a first amount per unit area locally onto first portions 400 of the deposited reactant material as shown in FIG. 26. The resulting reaction of the material 2402 with the second solution 2404 creates conductive circuit features 400-1, 400-2, 400-3, 400-4 and 400-5 using the same patterning arrangement as discussed above. At 2314, the second solution 2404 is deposited locally onto second portions of the reactant material 2402 in a lower second amount per unit area to create resistive circuit features 500-1, 500-2 and 500-3 as shown in FIG. 27. At 2316 in FIG. 23, the second solution 2404 is deposited locally onto third portions of the reactant material 2402 at a still lower third amount per unit area for creating gradient resistive circuit features 600-1 and 600-2 of FIG. 28. In FIG. 29, a further resistive feature 700 is formed by selective deposition of the second solution

Figure 30:
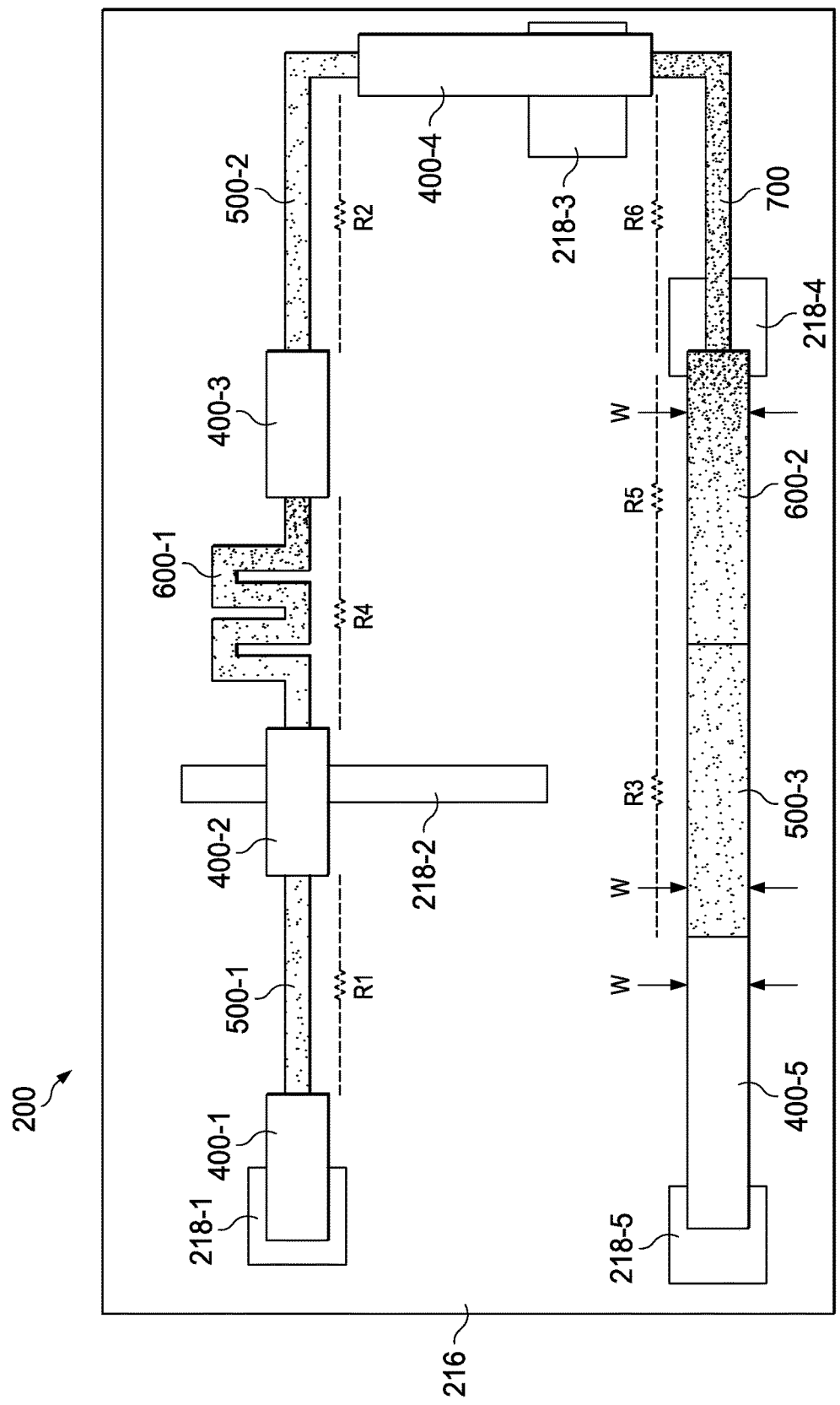
FIG. 30 is a partial top plan view of the integrated circuit of FIGS. 24-29 following removal of unreacted portions of the deposited reactant material.

2404 at an even lower amount per unit area to provide a higher resistivity in the deposition region 700. At 2318 in FIG. 23, unreacted portions of the deposited reactant material 2402 are optionally removed to expose the formed conductive and resistive circuit features 400, 500, 600 and 700 as well as the upper dielectric 216 and exposed portions of the corresponding ILD contact structures 218 as shown in FIG. 30.

Figure 31:
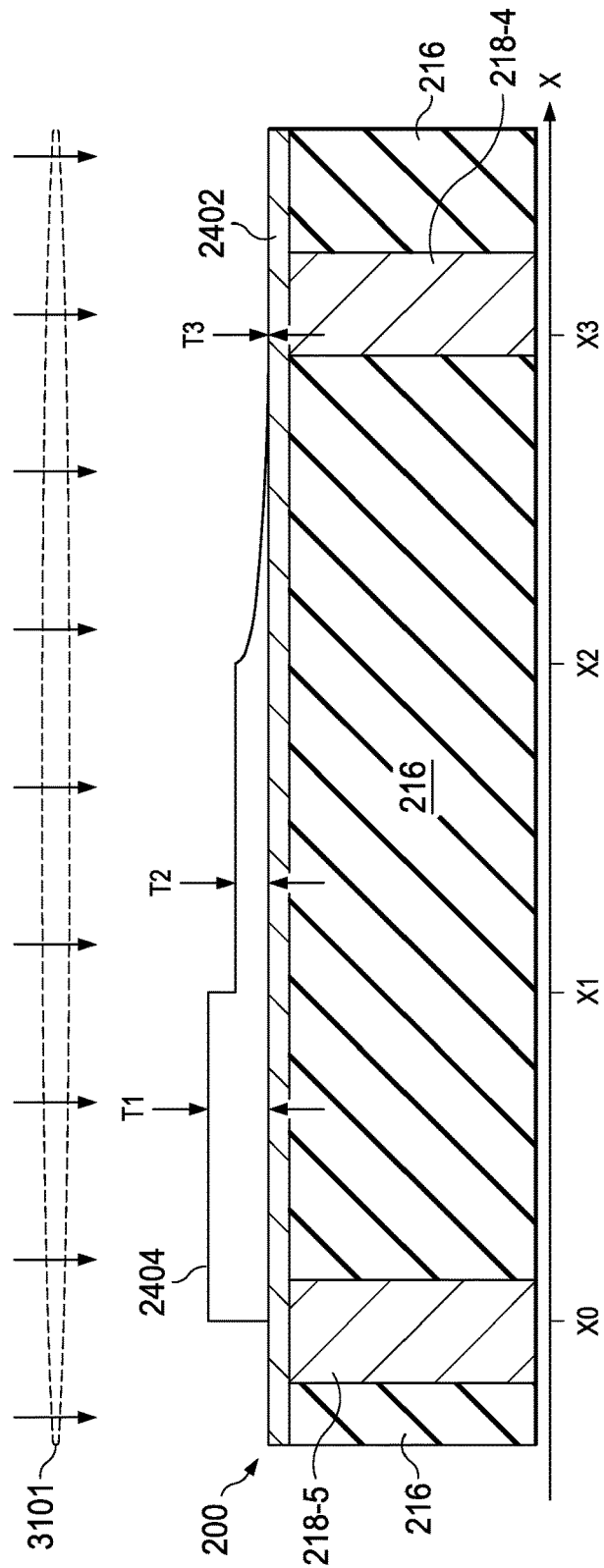
FIG. 31 is a partial side elevation view of selective deposition of the second solution to form the conductive, resistive and gradient resistive structures of FIG. 30.
Figure 32:
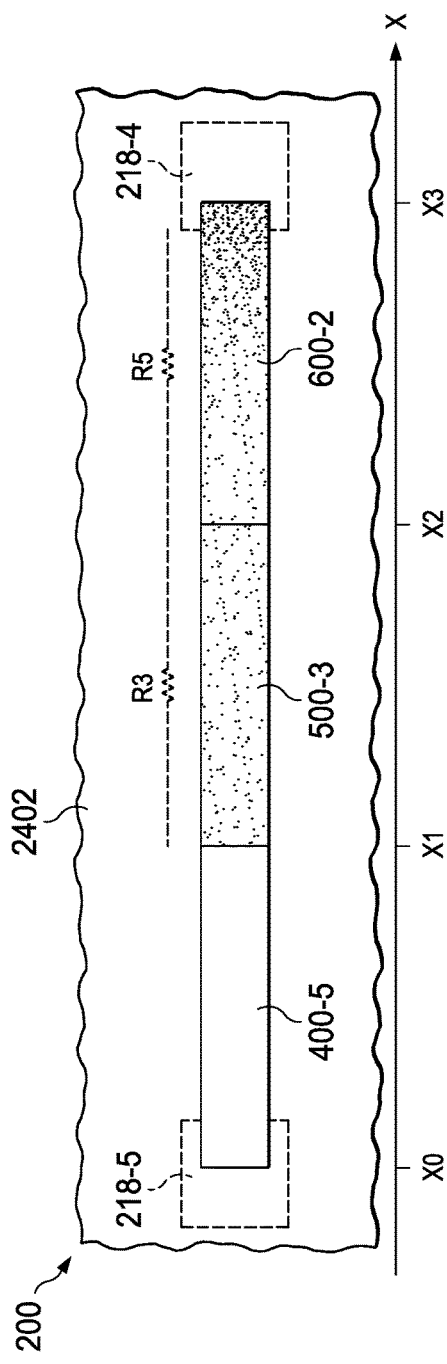
FIG. 32 is a partial top plan view of the conductive, resistive and gradient resistive structures.
Figure 33:
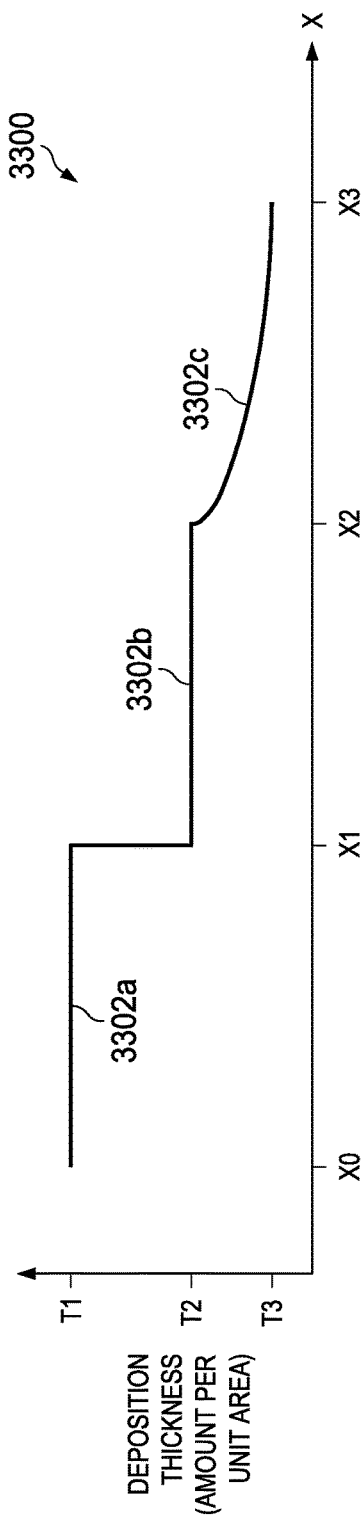
FIG. 33 is a graph of second solution deposition thickness or amount along the lateral direction in forming the conductive, resistive and gradient resistive structures of FIG. 31.

FIG. 31 shows a deposition process 3101 with varying amounts per unit area of the deposited second solution 2404. The solution 2402 has a first thickness T1 extending from the X-direction position X0 through X1 to form the conductive structure 400-5 shown in FIG. 32, and a smaller (e.g., shorter) thickness T2 from X1 through X2 to form the resistive structure 500-3. The deposition process 3101 employs a gradual reduction in the deposition thickness amount per unit area from X2 through X3 to transition from the second thickness T2 to a shorter thickness T3 at X3. The graph 3300 in FIG. 33 shows a curve 3302 of the deposition thickness along the X-direction including constant thickness portion 3302*a* (thickness T1), and 3302*b* (thickness T2), and a curved thickness profile 3302*c* transitioning from thickness T2 to thickness T3 at X3. Any unreacted portions of the deposited reactant material 2402 may then be removed at 2318 in FIG. 23. In this example, further backend processing and packaging is performed at 2320 to provide an integrated circuit 200 and complete the fabrication process 2300. As with the described examples of metallic nanoparticle selective illumination, the chemical reaction based variable impedance patterning processing 2308 may be performed on integrated circuits 200 as shown, as well as on printed circuit boards and other circuit structures.

The concepts of the described examples provide significant advantages over conventional metal layer processing, and facilitate cost effective compact metal layer fabrication to create conductive as well as resistive structures. In particular, the disclosed examples provide a continuous or discrete impedance gradient defined over a planar 2D, or 3D metallization surface in a low-cost and rapid manner, in which only one metallic nanoparticle or reactant material 202, 2302 is deposited and subsequently processed through selective energy or reaction solution application at controlled levels. The direct-writing patterning: (a) does not add any cost to the solution, because a curing step is already inherently required for solution deposited or additively deposited metals; and (b) provides directly embedded resistors within circuit board and/or integrated circuit metal layer traces, with the ability to provide fine-tuned gradient resistors for use in transmission lines or other applications requiring infinite impedance matching. The examples are useful to provide 2-D or 3-D impedance gradients for current distribution patterning and tapering, which is extremely advantageous for RF circuit implementations (such as matching networks and antennas/antenna arrays) and cannot be performed with standard metallization layers. The concepts of the disclosed examples are useful to provide invisible (visually imperceptible) circuits in which a metallization covers the entire surface but includes patterned conductive and resistive areas, such as for defense and/or security applications where hiding the visual pattern of the circuit board decreases chances of reverse engineering.

Modifications are possible in the described embodiments, and other embodiments are possible, within the scope of the claims.

What is claimed is:

1. An apparatus, comprising:
   electrical circuitry;
   a selectively sintered layer consisting of metallic nanoparticles, wherein:
   a first portion of the selectively sintered layer has a first electrical resistivity based in part on a first patterning of the metallic nanoparticles, wherein the first portion of the layer is a meandered shape;
   a second portion of the selectively sintered layer has a second electrical resistivity based in part on a second patterning of the metallic nanoparticles, wherein the second electrical resistivity is lower than the first electrical resistivity; and
   the selectively sintered layer having a gradient resistive portion that extends along a length from a first end to a second end of the selectively sintered layer and has an electrical resistivity profile that varies along at least a portion of the length; and
   conductive material connecting the electrical circuitry to at least one of the first and second portions.

2. The apparatus of claim 1, wherein the electrical resistivity profile of the gradient resistive portion varies continuously along at least the portion of the length.

3. The apparatus of claim 2, wherein the gradient resistive portion has a constant cross sectional area along at least the portion of the length.

4. The apparatus of claim 1, wherein the gradient resistive portion has a constant cross sectional area along at least the portion of the length.

5. The apparatus of claim 1, wherein the gradient resistive portion includes the first and second portions.

6. The apparatus of claim 1, wherein: the first portion is a resistive structure having the first electrical resistivity; and the second portion is a conductive structure having a conductive structure electrical resistivity lower than the first electrical resistivity.

7. The apparatus of claim 1, wherein: the first portion is a first resistive structure having the first electrical resistivity; and the second portion is a second resistive structure having the second electrical resistivity lower than the first electrical resistivity.

8. The apparatus of claim 1, wherein the layer is selectively sintered by applied energy.

9. The apparatus of claim 8, wherein the applied energy is optically applied energy.

10. The apparatus of claim 9, wherein the optically applied energy is from an illumination source.

11. The apparatus of claim 10, wherein the illumination source is a laser illumination source.

12. An apparatus, comprising:
    electrical circuitry;
    a selectively sintered layer consisting of metallic nanoparticles, wherein:
    a first portion of the selectively sintered layer has a first electrical resistivity based in part on a first patterning of the metallic nanoparticles, wherein the first portion of the layer is a meandered shape;
    a second portion of the selectively sintered layer has a second electrical resistivity based in part on a second patterning of the metallic nanoparticles, wherein the second electrical resistivity is lower than the first electrical resistivity;
    a third portion of the selectively sintered layer has a third electrical resistivity based in part on a third patterning of the metallic nanoparticles, wherein the third electrical resistivity is lower than the second electrical resistivity; and
    the selectively sintered layer having a gradient resistive portion that extends along a length from a first end to a second end of the selectively sintered layer and has an electrical resistivity profile that varies along at least a portion of the length; and conductive material connecting the electrical circuitry to at least two of the first, second and third portions.

13. The apparatus of claim 12, wherein the electrical resistivity profile of the gradient resistive portion varies continuously along at least the portion of the length.

14. The apparatus of claim 13, wherein the gradient resistive portion has a constant cross sectional area along at least the portion of the length.

15. The apparatus of claim 12, wherein the gradient resistive portion has a constant cross sectional area along at least the portion of the length.

16. The apparatus of claim 12, wherein the gradient resistive portion includes the first, second and third portions.

17. The apparatus of claim 12, wherein: the first portion is a first resistive structure having the first electrical resistivity; the second portion is a second resistive structure having the second electrical resistivity lower than the first electrical resistivity; and the third portion is a conductive structure having a conductive structure electrical resistivity lower than the second electrical resistivity.

18. The apparatus of claim 12, wherein the layer is selectively sintered by applied energy.

19. The apparatus of claim 18, wherein the applied energy is optically applied energy.

20. The apparatus of claim 19, wherein the optically applied energy is from an illumination source.

21. The apparatus of claim 20, wherein the illumination source is a laser illumination source.

* * * * *